United States Patent
Yu et al.

(10) Patent No.: US 12,232,382 B2
(45) Date of Patent: *Feb. 18, 2025

(54) DISPLAY SUBSTRATE AND MANUFACTURING METHOD THEREOF, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Pengfei Yu, Beijing (CN); Lu Bai, Beijing (CN); Jie Dai, Beijing (CN); Linhong Han, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/535,236

(22) Filed: Dec. 11, 2023

(65) Prior Publication Data

US 2024/0112638 A1 Apr. 4, 2024

Related U.S. Application Data

(63) Continuation of application No. 17/434,256, filed as application No. PCT/CN2020/084235 on Apr. 10, 2020, now Pat. No. 11,875,749.

(51) Int. Cl.
*G09G 3/3266* (2016.01)
*G11C 19/28* (2006.01)
*H10K 59/131* (2023.01)

(52) U.S. Cl.
CPC ........ *H10K 59/131* (2023.02); *G09G 3/3266* (2013.01); *G11C 19/28* (2013.01);
(Continued)

(58) Field of Classification Search
CPC ........ G09G 3/3266; G09G 2300/0426; G09G 2310/0286; G11C 19/28; H10K 59/131
See application file for complete search history.

(56) References Cited

U.S. PATENT DOCUMENTS 10,038,074 B2 7/2018 Chi
10,943,554 B2 3/2021 Wang et al.
(Continued)

FOREIGN PATENT DOCUMENTS

CN 106910453 A * 6/2017 ............... G09G 3/20
CN 109375832 A 2/2019
(Continued)

OTHER PUBLICATIONS

Office Action for corresponding Indian application No. 202217064031, dated Apr. 25, 2023.
(Continued)

*Primary Examiner* — Xuemei Zheng
(74) *Attorney, Agent, or Firm* — LEASON ELLIS LLP

(57) ABSTRACT

A display substrate and manufacturing method thereof, and a display device are provided. The display substrate includes a base substrate, and a shift register unit and a first clock signal line that are on the base substrate, the first clock signal line extends along a first direction on the base substrate and is configured to provide a first clock signal to the shift register unit, the shift register unit includes an input circuit, an output circuit, a first control circuit and an output control circuit, and the input circuit includes an input transistor, an active layer of the input transistor is in a strip shape
(Continued)

extending along a second direction, and the second direction is different from the first direction.

17 Claims, 13 Drawing Sheets

(52) U.S. Cl.
CPC ............... *G09G 2300/0426* (2013.01); *G09G 2300/0852* (2013.01); *G09G 2310/0286* (2013.01)

(56) References Cited

U.S. PATENT DOCUMENTS

| | | | |
|---|---|---|---|
| 11,127,340 | B2 | 7/2021 | Byun et al. |
| 11,393,373 | B2 | 7/2022 | Huang et al. |
| 11,581,051 | B2 | 2/2023 | Zheng |
| 11,990,090 | B2 * | 5/2024 | Yu .................. G09G 3/3225 |
| 2004/0217935 | A1 | 11/2004 | Jeon et al. |
| 2017/0178558 | A1 | 6/2017 | Zhou et al. |
| 2018/0182345 | A1 | 6/2018 | Seong et al. |
| 2019/0295673 | A1 | 9/2019 | Umezaki |
| 2019/0325834 | A1 | 10/2019 | Feng et al. |
| 2020/0013473 | A1 | 1/2020 | Xuan et al. |
| 2022/0302240 | A1 | 9/2022 | Zhang et al. |
| 2022/0319410 | A1 | 10/2022 | Yu et al. |
| 2022/0343854 | A1 | 10/2022 | Li et al. |

FOREIGN PATENT DOCUMENTS

| | | |
|---|---|---|
| CN | 109712551 A | 5/2019 |
| CN | 110416226 A | 11/2019 |
| CN | 110767665 A | 2/2020 |
| KR | 20200003125 A | 1/2020 |
| WO | 2019148970 A1 | 8/2019 |
| WO | 2021217546 A1 | 11/2021 |

OTHER PUBLICATIONS

Extended European search report for corresponding European application No. 20929986.6, dated May 12, 2023.
Non-Final Office Action for related U.S. Appl. No. 17/434,256, dated May 25, 2023.
Notice of Allowance for related U.S. Appl. No. 17/434,256, dated Sep. 7, 2023.
Office Action for U.S. Appl. No. 18/136,097 mailed Feb. 15, 2024.
Office Action Korean Application No. 10-2022-7039135 mailed Feb. 28, 2024.

* cited by examiner

FIG/ 7E

DISPLAY SUBSTRATE AND MANUFACTURING METHOD THEREOF, DISPLAY DEVICE

This application is a continuation application of U.S. patent application Ser. No. 17/434,256 filed on Aug. 26, 2021, which is a U.S. National Phase Entry of International Application No. PCT/CN2020/084235 filed Apr. 10, 2020. The above-identified applications are incorporated by reference herein in their entirety.

TECHNICAL FIELD

At least one embodiment of the present disclosure relates to a display substrate and a manufacturing method thereof, and a display device.

BACKGROUND

In the field of display technology, a pixel array such as a liquid crystal display panel or an Organic Light-emitting Diode, OLED display panel usually includes a plurality of rows of gate lines and a plurality of columns of data lines interlaced with the gate lines. The driving of the gate line can be realized by a bonded integrated driving circuit. In recent years, with the continuous improvement of the preparation technology of amorphous silicon thin film transistors or oxide thin film transistors, the gate driving circuit may be directly integrated on a thin film transistor array substrate to form a GOA (Gate driver On Array) to drive the gate lines. For example, a GOA including a plurality of cascaded shift register units may be used to provide switching voltage signals (scanning signals) for the plurality of rows of gate lines of the pixel array, so as to control the plurality of rows of gate lines to be turn on in sequence, and at the same time, data signals are provided to pixel units in corresponding rows in the pixel array by the data lines, so that gray voltages required for displaying various gray scales of an image are formed in each pixel unit, and then a frame of image is displayed.

SUMMARY

At least one embodiment of the present disclosure provides a display substrate, comprising: a base substrate, and a shift register unit and a first clock signal line that are on the base substrate; the first clock signal line extends along a first direction on the base substrate and is configured to provide a first clock signal to the shift register unit; the shift register unit comprises an input circuit, an output circuit, a first control circuit and an output control circuit; the input circuit is configured to input an input signal to a first node in response to the first clock signal; the output circuit is configured to output an output signal to an output terminal; the first control circuit is configured to control a level of a second node in response to a level of the first node and the first clock signal; and the output control circuit is configured to control a level of the output terminal under control of a level of the second node; the input circuit comprises an input transistor, an active layer of the input transistor is in a strip shape extending along a second direction, and the second direction is different from the first direction; the input transistor comprises a first gate electrode, a second gate electrode and a connection electrode connecting the first gate electrode and the second gate electrode; and the connection electrode comprises a first part which is connected to the first gate electrode and extends along the first direction, a second part which is connected to the second gate electrode, and a third part which extends along the second direction and is connected to the first part and the second part, and the third part of the connection electrode is connected to the first clock signal line to receive the first clock signal.

For example, in the display substrate provided by at least an embodiment of the present disclosure, an included angle between the first direction and the second direction is between 70 degrees and 90 degrees.

For example, in the display substrate provided by at least an embodiment of the present disclosure, a first electrode of the input transistor is connected to a signal input electrode through a first connection wire extending along the second direction to receive the input signal.

For example, in the display substrate provided by at least an embodiment of the present disclosure, the shift register unit further comprises a wire transfer electrode, the first electrode of the input transistor is electrically connected to a first end of the wire transfer electrode, the wire transfer electrode is in a different layer from the active layer of the input transistor, a second end of the wire transfer electrode is connected to a first end of the first connection wire, the wire transfer electrode is in a different layer from the first connection wire, a second end of the first connection wire is electrically connected to the signal input electrode, and the wire transfer electrode is in a same layer as the signal input electrode.

For example, in the display substrate provided by at least an embodiment of the present disclosure, the shift register unit further comprises a first insulation layer, a second insulation layer, and a third insulation layer, the first insulation layer is between the active layer of the input transistor and the first connection wire, and the second insulation layer and third insulation layer are between the first connection wire and the wire transfer electrode; and the first electrode of the input transistor is in a same layer as the wire transfer electrode, and the second end of the wire transfer electrode is connected to the first end of the first connection wire through a via hole penetrating through the second insulation layer and the third insulation layer, and the second end of the first connection wire is electrically connected to the signal input electrode through a via hole penetrating through the second insulation layer and the third insulation layer.

For example, in the display substrate provided by at least an embodiment of the present disclosure, the display substrate further comprises a second clock signal line configured to provide a second clock signal to the shift register unit, and the shift register unit further comprises a second control circuit, the second control circuit is connected to the first node and the second node and is configured to control the level of the first node under control of the level of the second node and the second clock signal.

For example, in the display substrate provided by at least an embodiment of the present disclosure, the second control circuit comprises a first noise reduction transistor and a second noise reduction transistor; an active layer of the first noise reduction transistor and an active layer of the second noise reduction transistor are a continuous noise reduction semiconductor layer, and the noise reduction semiconductor layer extends along the first direction and is arranged side by side with the active layer of the input transistor in the first direction; a gate electrode of the first noise reduction transistor and a gate electrode of the second noise reduction transistor extend along the second direction and are arranged side by side in the first direction; and the first electrode of the input transistor is connected to the first node, and the gate electrode of the first noise reduction transistor is connected to the second node.

For example, in the display substrate provided by at least an embodiment of the present disclosure, the gate electrode of the second noise reduction transistor is electrically connected to the second clock signal line through a third connection wire, the third connection wire comprises a third sub-connection wire and a fourth sub-connection wire, the third sub-connection wire is connected to the gate electrode of the second noise reduction transistor and extends along the first direction, an orthographic projection of the third sub-connection wire on the base substrate and an orthographic projection of the active layer of the second noise reduction transistor on the base substrate are oppositely arranged side by side in the second direction, the fourth sub-connection wire is connected to the third sub-connection wire and the second clock signal line and extends along the second direction, and an orthographic projection of the fourth sub-connection wire on the base substrate is on a side of an orthographic projection of the active layer of the second noise reduction transistor on the base substrate away from an orthographic projection of the active layer of the first noise reduction transistor on the base substrate.

For example, the display substrate provided by at least an embodiment of the present disclosure, further comprises a fourth connection wire, a first insulation layer, a second insulation layer, and a third insulation layer, the first insulation layer is between the active layer of the input transistor and a gate electrode of the input transistor, and the second insulation layer and third insulation layer are between the gate electrode of the input transistor and the fourth connection wire; and the third sub-connection wire and the fourth sub-connection wire are integral, and the third sub-connection wire is connected to the fourth connection wire through a via hole penetrating through the second insulation layer and the third insulation layer.

For example, in the display substrate provided by at least an embodiment of the present disclosure, further comprises a fourth connection wire, a first insulation layer, a second insulation layer, and a third insulation layer, the first insulation layer is between the active layer of the input transistor and a gate electrode of the input transistor, and the second insulation layer and third insulation layer are between the gate electrode of the input transistor and the fourth connection wire; and the third sub-connection wire is connected to the fourth connection wire through a via hole penetrating the second insulation layer and the third insulation layer, and the fourth sub-connection wire is connected to the fourth connection wire through a via hole penetrating the second insulation layer and the third insulation layer.

For example, in the display substrate provided by at least an embodiment of the present disclosure, the first control circuit comprises a first control transistor and a second control transistor; and an active layer of the first control transistor and an active layer of the second control transistor are a continuous control semiconductor layer, the control semiconductor layer extends along the first direction, and a gate electrode of the first control transistor and a gate electrode of the second control transistor extend along the second direction and are arranged side by side in the first direction.

For example, in the display substrate provided by at least an embodiment of the present disclosure, the active layer of the first control transistor, the active layer of the second control transistor and the active layer of the input transistor are arranged side by side in the second direction.

For example, in the display substrate provided by at least an embodiment of the present disclosure, the active layer of the input transistor is on an imaginary line on which the active layer of the first noise reduction transistor and the active layer of the second noise reduction transistor extend along the first direction, and the active layer of the first control transistor and the active layer of the second control transistor are on an imaginary line on which the active layer of the input transistor extends along the second direction.

For example, in the display substrate provided by at least an embodiment of the present disclosure, the shift register unit further comprises an intermediate transfer electrode, the active layer of the first control transistor and the active layer of the second control transistor are arranged side by side with the active layer of the first noise reduction transistor and the active layer of the second noise reduction transistor in the second direction, an orthographic projection of the intermediate transfer electrode on the base substrate is between an orthographic projection of the active layer of the first control transistor and the active layer of the second control transistor on the base substrate and an orthographic projection of the active layer of the first noise reduction transistor and the active layer of the second noise reduction transistor on the base substrate, and the gate electrode of the first noise reduction transistor is connected to a first electrode of the first control transistor and a first electrode of the second control transistor through the intermediate transfer electrode.

For example, in the display substrate provided by at least an embodiment of the present disclosure, the second node comprises the intermediate transfer electrode.

For example, in the display substrate provided by at least an embodiment of the present disclosure, the shift register unit further comprises a first insulation layer and a second insulation layer, the first insulation layer is between the active layer of the first noise reduction transistor and the gate electrode of the first noise reduction transistor in a direction perpendicular to the base substrate; the second insulation layer is between the gate electrode of the first noise reduction transistor and the intermediate transfer electrode in the direction perpendicular to the base substrate; and the gate electrode of the first noise reduction transistor is connected to a first end of the intermediate transfer electrode through a via hole penetrating through the second insulation layer, and the first electrode of the first control transistor and the first electrode of the second control transistor are connected to a second end of the intermediate transfer electrode and in a same layer as the intermediate transfer electrode.

For example, in the display substrate provided by at least an embodiment of the present disclosure, the second node comprises the intermediate transfer electrode.

For example, in the display substrate provided by at least an embodiment of the present disclosure, the shift register unit further comprises a first insulation layer, a second insulation layer, a third insulation layer, and a second connection wire, the first insulation layer is between the active layer of the first noise reduction transistor and the gate electrode of the first noise reduction transistor in a direction perpendicular to the base substrate; the second insulation layer is between the gate electrode of the first noise reduction transistor and the intermediate transfer electrode in the direction perpendicular to the base substrate; the third insulation layer is between the intermediate transfer electrode and the second connection wire in the direction perpendicular to the base substrate, and the second connection wire comprises a first sub-connection wire and a second connection sub-wire; and the gate electrode of the first noise reduction transistor is connected to the first sub-connection wire through a via hole penetrating the second insulation layer and the third insulation layer, and a first end of the intermediate transfer electrode is connected to the first sub-connection wire through a via hole penetrating the third insulation layer, the first electrode of the first control transistor and the first electrode of the second control transistor are connected to the second connection sub-wire and are in a same layer as the second connection sub-wire, and a second end of the intermediate transfer electrode is connected to the second connection sub-wire through a via hole penetrating through the third insulation layer.

For example, in the display substrate provided by at least an embodiment of the present disclosure, the second node comprises the intermediate transfer electrode and the second connection wire.

For example, in the display substrate provided by at least an embodiment of the present disclosure, the shift register unit further comprises a voltage stabilization circuit, the voltage stabilization circuit is connected to the first node and the third node, and is configured to stabilize a level of the third node; and the output circuit is connected to the third node, and is configured to output the output signal to the output terminal under control of the level of the third node.

For example, the display substrate provided by at least an embodiment of the present disclosure, further comprises a first power line and a second power line which are configured to supply a first voltage and a second voltage to the shift register unit, wherein the voltage stabilization circuit comprises a voltage stabilization transistor, the second power line comprises a protrusion portion protruding in the second direction, an orthographic projection of an active layer of the voltage stabilization transistor on the base substrate is between an orthographic projection of the active layer of the second control transistor on the base substrate and an orthographic projection of an active layer of the second noise reduction transistor on the base substrate in the first direction, and a second electrode of the second control transistor and a gate electrode of the voltage stabilization transistor are both connected to the protrusion portion of the second power line to receive the second voltage; and a first electrode of the voltage stabilization transistor is connected to the third node, and a second electrode of the voltage stabilization transistor is connected to the first node.

For example, in the display substrate provided by at least an embodiment of the present disclosure, a first electrode of the input transistor is connected to a signal input electrode to receive the input signal; the output control circuit comprises an output control transistor and a first capacitor; and a first electrode of the first capacitor and a second electrode of the first capacitor respectively comprise a notch, and an orthographic projection of the signal input electrode on the base substrate is within an orthographic projection of the notch of the first capacitor on the base substrate.

For example, in the display substrate provided by at least an embodiment of the present disclosure, the output circuit comprises an output transistor and a second capacitor, a first electrode of the output transistor is connected to the fourth connection wire, the fourth connection wire is connected to the second clock signal line through the third connection wire, and an orthographic projection of the third sub-connection wire of the third connection wire on the base substrate is on a side of the orthographic projection of the active layer of the second noise reduction transistor on the base substrate close to an orthographic projection of an active layer of the output transistor on the base substrate; and a gate electrode of the output transistor is electrically connected to a first electrode of a voltage stabilization transistor, and a second electrode of the output transistor is connected to the output terminal.

For example, in the display substrate provided by at least an embodiment of the present disclosure, a shape of the second capacitor is a rectangle.

For example, in the display substrate provided by at least an embodiment of the present disclosure, in a case where the output control circuit comprises an output control transistor and a first capacitor, an active layer of the output control transistor and the active layer of the output transistor are integral and extend along the first direction; a gate electrode of the output control transistor and the gate electrode of the output transistor extend along the second direction and are arranged side by side in the first direction; and in a case where the display substrate comprises a first power line, a first electrode of the output control transistor is electrically connected to the first power line to receive a first voltage.

For example, in the display substrate provided by at least an embodiment of the present disclosure, the second electrode of the output transistor is connected to a signal input electrode of a next stage of shift register unit adjacent to the shift register unit.

For example, the display substrate provided by at least an embodiment of the present disclosure, further comprises a pixel array region and a peripheral region, the first power line, the second power line, the first clock signal line, the second clock signal line and the shift register unit are in the peripheral region; orthographic projections of the second power line, the first clock signal line and the second clock signal line on the base substrate are on a side of an orthographic projection of the shift register unit on the base substrate away from the pixel array region; and an orthographic projection of the first power line on the base substrate is on a side of the orthographic projection of the shift register unit on the base substrate close to the pixel array region.

For example, in the display substrate provided by at least an embodiment of the present disclosure, further comprises a first power line, a second control circuit, a voltage stabilization circuit, a first transfer electrode, a second transfer electrode, and a third transfer electrode, the first power line is configured to provide a first voltage to the shift register unit; the second control circuit is connected to the first node and the second node, and is configured to control the level of the first node under control of the level of the second node and the second clock signal; the voltage stabilization circuit is connected to the first node and the third node, and is configured to stabilize a level of the third node; the first control circuit comprises a first control transistor and a second control transistor, the second control circuit comprises a first noise reduction transistor and a second noise reduction transistor, the voltage stabilization circuit comprises a voltage stabilization transistor, the output control circuit comprises an output control transistor and a first capacitor, and the output circuit comprises an output transistor and a second capacitor, the first transfer electrode is connected to a first electrode of the input transistor, a gate electrode of the first control transistor, a second electrode of the voltage stabilization transistor and a first electrode of the second noise reduction transistor, and the first transfer electrode are in a different layer from the gate electrode of the first control transistor; the second transfer electrode is connected to a first electrode of the voltage stabilization transistor and a gate electrode of the output transistor, wherein the second transfer electrode are in a different layer from the gate electrode of the output transistor; and the third transfer electrode is connected to a first electrode of the first noise reduction transistor and a first electrode of the output control transistor, and is connected to the first power line.

For example, in the display substrate provided by at least an embodiment of the present disclosure, the first node comprises the first transfer electrode, and the third node comprises the second transfer electrode.

At least one embodiment of the present disclosure provides a display device, comprising the display substrate provided by any embodiment of the present disclosure.

For example, in the display device provided by at least an embodiment of the present disclosure, the display device is an organic light-emitting diode display device.

For example, the display device provided by at least an embodiment of the present disclosure further comprises pixel units arranged in an array, wherein the output signal output by the output circuit of the shift register unit is configured as a gate scanning signal to drive the pixel units to emit light.

At least one embodiment of the present disclosure provides a manufacturing method of the display substrate provided by any embodiment of the present disclosure, and the manufacturing method comprises: providing the base substrate; forming the shift register unit, a first power line, a second power line, the first clock signal line and a second clock signal line on the base substrate; forming the shift register unit comprises: sequentially forming a semiconductor layer, a first insulation layer, a first conductive layer, a second insulation layer, a second conductive layer, a third insulation layer and a third conductive layer in a direction perpendicular to the base substrate, an active layer of each transistor is in the semiconductor layer, a gate electrode of each transistor and a first electrode of each capacitor are in the first conductive layer, a second electrode of each capacitor is in the second conductive layer, and the first power line, the second power line, the first clock signal line, a first electrode of each transistor and a second electrode of each transistor are in the third conductive layer; and respective transistors and respective capacitors are connected to each other and are connected to the first power line, the second power line, the first clock signal line and the second clock signal line through via holes penetrating through the first insulation layer, the second insulation layer or the third insulation layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 7E is a sectional view of some examples of the display substrate as shown in FIG. 2B taken along a direction D-D';

DETAILED DESCRIPTION

Figure 1A:
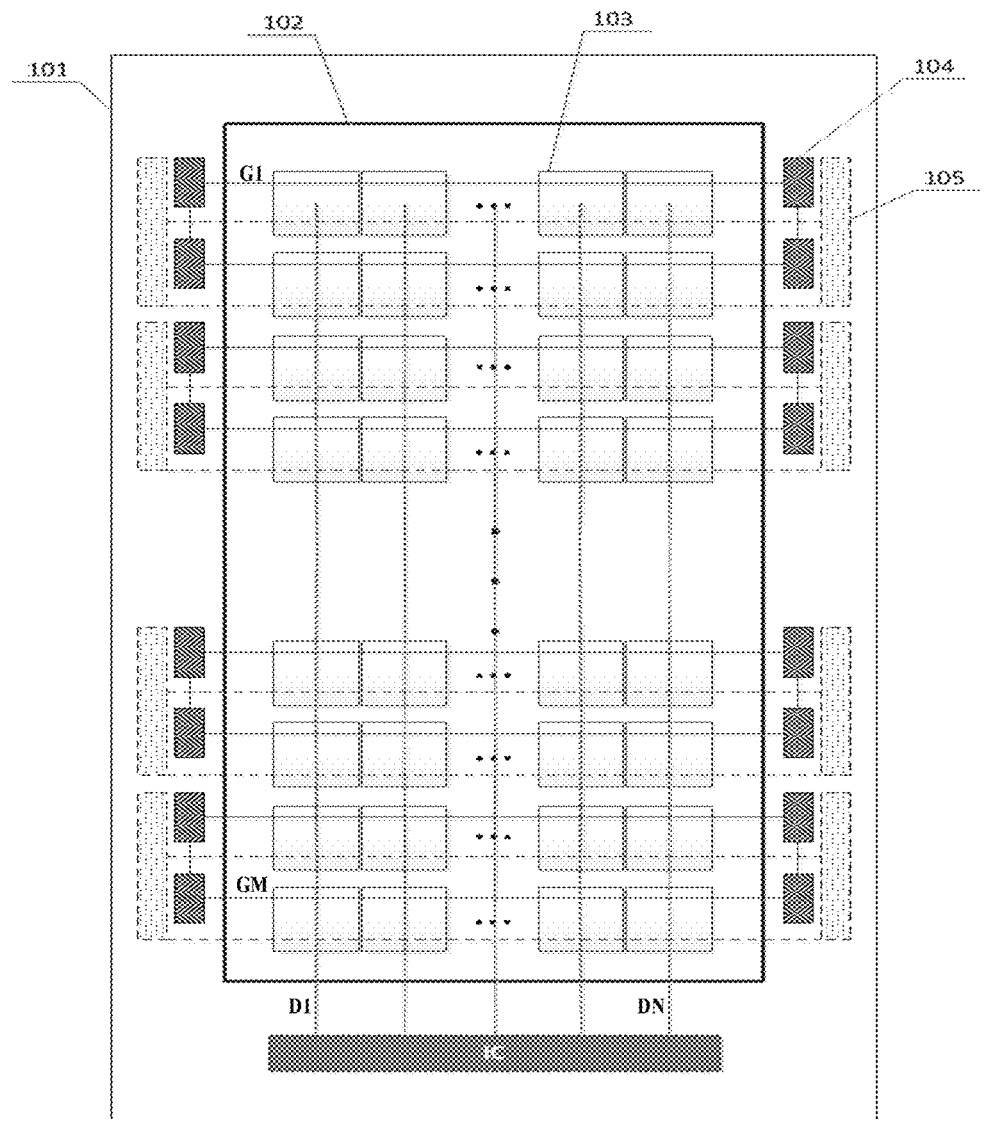
FIG. 1A is a schematic diagram of an overall circuit architecture of a display panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The present disclosure is explained by several specific embodiments. In order to keep the following description of embodiments of the present invention clear and concise, detailed descriptions of known functions and known components may be omitted. In the case that any component of an embodiment of the present invention appears in more than one drawing, the component is denoted by the same reference numeral in each drawing.

FIG. 1A is a schematic diagram of an overall circuit architecture of a display panel. For example, as shown in FIG. 1A, 101 denotes an overall outer frame line of the display panel; the display panel includes an effective display region (i.e., a pixel array region) 102 and a peripheral region located around the effective display region 102. The effective display region includes pixel units 103 arranged in an array; the peripheral region includes a shift register unit 104, and a plurality of cascaded shift register units 104 constitute a gate driving circuit configured to provide, for example, a gate scanning signal shifted row by row to the pixel units 103 arranged in an array in the effective display region 102 of the display panel 101; the peripheral region further includes a light-emitting control unit 105, and a plurality of cascaded light-emitting control units 105 constitute a light-emitting control array which is configured to provide light-emitting control signals, for example, shifted row by row, to the pixel units 103 arranged in the array in the effective display region 102 of the display panel 101.

As shown in FIG. 1A, a data line D1-DN (N is an integer greater than 1) connected to a data driving chip IC longitudinally passes through the effective display region 102 to provide a data signal for the pixel units 103 arranged in an array; gate lines G1-GM (M is an integer greater than 1) connected to the shift register unit 104 and the light-emitting control unit 105 transversely pass through the effective display region 102 to provide a gate scanning signal and a light-emitting control signal to the pixel units arranged in an array. For example, each pixel unit 103 may include a pixel circuit and a light-emitting element with a circuit structure such as 7T1C, 8T2C or 4T1C in the art. The pixel circuit operates under control of the data signal transmitted through the data lines and the gate scanning signal and the light-emitting control signal transmitted through the gate lines to drive the light-emitting element to emit light, thereby realizing display and other operations. The light-emitting element may be, for example, an organic light-emitting diode (OLED) or a quantum dot light-emitting diode (QLED).

Figure 1B:
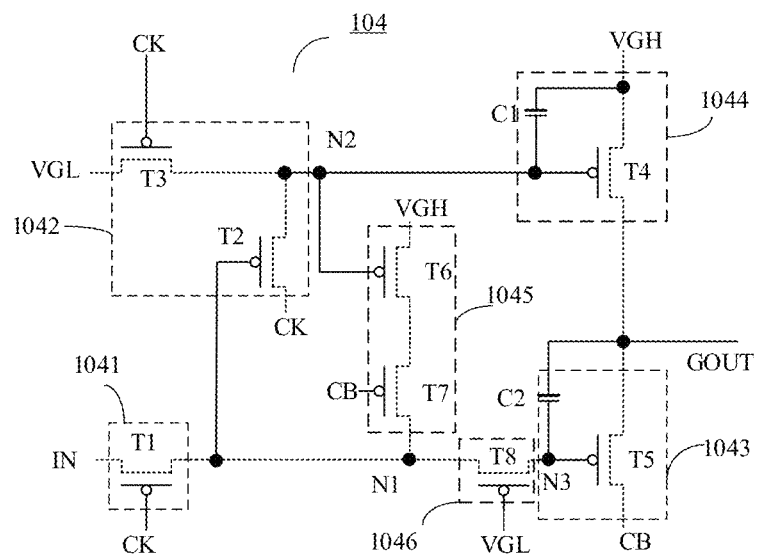
FIG. 1B is a circuit diagram of a shift register unit.
Figure 1C:
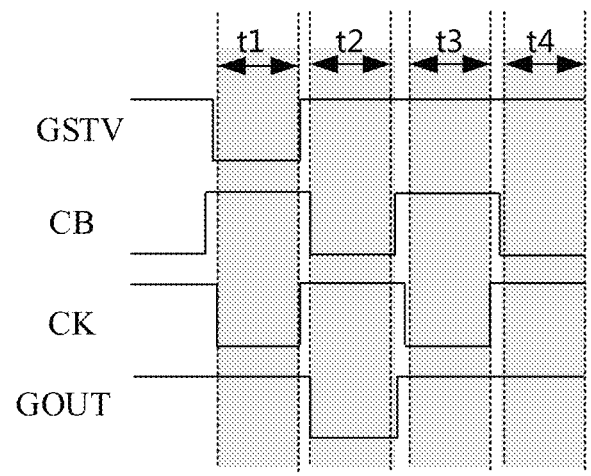
FIG. 1C is a signal timing diagram in the case that the shift register unit shown in FIG. 1B works.

FIG. 1B is a circuit structure diagram of a shift register unit. FIG. 1C is a signal timing diagram in the case that the shift register unit shown in FIG. 1B works. The working process of the shift register unit is briefly described with reference to FIG. 1B and FIG. 1C.

As shown in FIG. 1B, the shift register unit 104 includes eight transistors (an input transistor T1, a first control transistor T2, a second control transistor T3, an output control transistor T4, an output transistor T5, a first noise reduction transistor T6, a second noise reduction transistor T7 and a voltage stabilization transistor T8) and two capacitors (a first capacitor C1 and a second capacitor C2). For example, in the case that a plurality of shift register units 104 are cascaded, a first electrode of the input transistor T1 in a first stage of shift register unit 104 is connected to an input terminal IN, the input terminal IN is configured to be connected to a trigger signal line GSTV to receive a trigger signal as an input signal, while a first electrode of each input transistor T1 in other stages of shift register units 104 is electrically connected to an output terminal of a previous stage of shift register unit 104 to receive an output signal output by an output terminal GOUT of the previous stage of shift register unit 104 as an input signal, thereby realizing shift output for performing, for example, progressive scanning on the array of pixel units in the active display region.

In addition, as shown in FIG. 1B, the shift register unit further includes a first clock signal terminal CK and a second clock signal terminal CB, GCK represents a first sub-clock signal line and GCB represents a second sub-clock signal line. For example, in the case that the first clock signal terminal CK is connected to the first sub-clock signal line GCK to receive a first clock signal, the first sub-clock signal line GCK is a first clock signal line; in the case that the first clock signal terminal CK is connected to the second sub-clock signal line GCB to receive the first clock signal, the second sub-clock signal line GCB is the first clock signal line, which depends on the specific situation, and no limitation is imposed to this case in embodiments of the present disclosure. The second clock signal terminal CB is connected to the second sub-clock signal line GCB or the first sub-clock signal line GCK to receive a second clock signal. The case that the first clock signal terminal CK is connected to the first sub-clock signal line GCK to receive the first clock signal, and the second clock signal terminal CB is connected to the second sub-clock signal line GCB to receive the second clock signal is taken as an example. That is, the first sub-clock signal line GCK is taken as the first clock signal line and the second sub-clock signal line GCB is taken as the second clock signal line, the embodiments of the present disclosure are not limited to this case. For example, the first clock signal GCK and the second clock signal GCB may adopt a pulse signal with a duty ratio greater than 50%, and the difference between the first clock signal GCK and the second clock signal GCB is, for example, half a period; VGH represents a first power line and a first voltage provided by the first power line, for example, the first voltage is in a DC high level; VGL represents a second power line and a second voltage provided by the second power line, for example, the second voltage is in a DC low level and the first voltage is greater than the second voltage; N1, N2 and N3 respectively represent a first node, a second node and a third node in the circuit diagram.

As shown in FIG. 1B, a gate electrode of the input transistor T1 is connected to the first clock signal terminal CK (the first clock signal terminal CK is connected to the first sub-clock signal line GCK) to receive the first clock signal, a second electrode of the input transistor T1 is connected to the input terminal IN, and the first electrode of the input transistor T1 is connected to the first node N1. For example, in the case that the shift register unit is a first-stage of shift register unit, the input terminal IN is connected to the trigger signal line GSTV to receive the trigger signal, and in the case that the shift register unit is a shift register unit in other stages except the first-stage of shift register unit, the input terminal IN is connected to the output terminal GOUT of a previous stage of shift register unit.

A gate electrode of the first control transistor T2 is connected to the first node N1, a second electrode of the first control transistor T2 is connected to the first clock signal terminal CK to receive the first clock signal, and a first electrode of the first control transistor T2 is connected to the second node N2.

A gate electrode of the second control transistor T3 is connected to the first clock signal terminal CK to receive the first clock signal, a second electrode of the second control transistor T3 is connected to a second power line VGL to receive a second voltage, and a first electrode of the second control transistor T3 is connected to the second node N2. A gate electrode of the output control transistor T4 is connected to the second node N2, a first electrode of the output control transistor T4 is connected to a first power line VGH to receive a first voltage, and a second electrode of the output control transistor T4 is connected to the output terminal GOUT.

A first electrode of the first capacitor is connected to the second node N2, and a second electrode of the first capacitor C1 is connected to the first power line VGH.

A gate electrode of the output transistor T5 is connected to the third node N3, a first electrode of the output transistor T5 is connected to the second clock signal terminal CB, and a second electrode of the output transistor T5 is connected to the output terminal GOUT.

A first electrode of the second capacitor C2 is connected to the third node N3, and a second electrode of the second capacitor C2 is connected to the output terminal GOUT.

A gate electrode of the first noise reduction transistor T6 is connected to the second node N2, a first electrode of the first noise reduction transistor T6 is connected to the first power line VGH to receive the first voltage, and a second electrode of the first noise reduction transistor T6 is connected to a second electrode of the second noise reduction transistor T7.

A gate electrode of the second noise reduction transistor T7 is connected to the second clock signal terminal CB (the second clock signal terminal CB is connected to the second sub-clock signal line GCB) to receive the second clock signal, and a first electrode of the second noise reduction transistor T7 is connected to the first node N1.

A gate electrode of the voltage stabilization transistor T8 is connected to the second power line VGL to receive the second voltage, a second electrode of the voltage stabilization transistor T8 is connected to the first node N1, and a first electrode of the voltage stabilization transistor T8 is connected to the third node N3.

The case that the transistors in the shift register unit 104 shown in FIG. 1B are all P-type transistors is taken as an example, that is, each transistor is turned on in the case that the gate electrode is at a low level (turn-on level), and turned off in the case that the gate electrode is at a high level (turn-off level). In this case, the first electrode of each transistor may be a source electrode, and the second electrode of each transistor may be a drain electrode.

The shift register unit includes, but is not limited to, the configuration shown in FIG. 1B. For example, the transistors in the shift register unit 104 may adopt N-type transistors or a mixture of P-type transistors and N-type transistors, so long as the port polarity of the selected type of transistor is connected according to the port polarity of the corresponding transistor in the embodiment of the disclosure at the same time.

It should be noted that all the transistors adopted in the shift register unit may be thin film transistors, field effect transistors or other switching elements with the same characteristics. Here, the case that all the transistors are thin film transistors is taken as an example for explanation. For example, the active layer (channel region) of each transistor is made of a semiconductor material, such as polysilicon (such as low-temperature polysilicon or high-temperature polysilicon), amorphous silicon and indium gallium tin oxide (IGZO), and so on, while the gate electrode, the source electrode and the drain electrode are made of a metal material, such as metallic aluminum or aluminum alloy. The source electrode and the drain electrode of the transistor adopted here may be symmetrical in structure, so there is no difference in structure between the source electrode and the drain electrode. In the embodiments of the present disclosure, in order to distinguish the two electrodes of a transistor except the gate electrode, it is directly described that one electrode is the first electrode and the other electrode is the second electrode. In addition, in the embodiments of the present disclosure, the electrodes of the capacitor may be metal electrodes or one of the electrodes of the capacitor is made of a semiconductor material (e.g., doped polysilicon).

FIG. 1C is a signal timing diagram in the case that the shift register unit 104 shown in FIG. 1B works. The working process of the shift register is described in detail with reference to FIG. 1B and FIG. 1C. For example, the working principle of the first stage of shift register unit 104 is described, and the working principles of the other stages of shift register units 104 are similar to them, so they are not described again. As shown in FIG. 1C, the working process of the shift register unit 104 includes four stages which are a first phase t1, a second phase t2, a third phase t3 and a fourth phase t4. FIG. 1C shows a timing waveform of the signals in each phase.

In the first phase t1, as shown in FIG. 1C, the first clock signal terminal CK receives a low-level first clock signal, and the trigger signal line GSTV provides a low-level trigger signal, so the input transistor T1 and the second control transistor T3 are turned on, and the turned-on input transistor t1 transmits the low-level trigger signal to the first node N1, so that the level of the first node N1 becomes a low level, so the first control transistor T2 and the output transistor T5 are turned on. Because the voltage stabilization transistor T8 is always turned on in response to the second voltage (low level) provided by the second power line VGL, the level of the third node N3 is the same as the level of the first node N1, i.e., low level, and at the same time, this low level is stored in the second capacitor C2. In addition, the turned-on second control transistor T3 transmits the low level second voltage VGL to the second node N2, and the turned-on first control transistor T2 transmits the low level of the first clock signal to the second node N2, so that the level of the second node N2 becomes a low level and is stored in the first capacitor C1, and therefore the output control transistor T4 is turned on in response to the low level of the second node N2, to output the high-level first voltage provided by the first power line VGH to the output terminal GOUT, and at the same time, the output transistor T5 is turned on in response to the low level of the third node N3 to transmit the high-level second clock signal received by the second clock signal terminal CB to the output terminal GOUT, so that at this phase, the shift register unit outputs a high level.

In the second phase t2, as shown in FIG. 1C, the second clock signal terminal CB receives a low-level second clock signal, so that the second noise reduction transistor T7 is turned on, and the first clock signal terminal CK receives a high-level first clock signal, and therefore the input transistor T1 and the second control transistor T3 are turned off. Because of the storage effect of the second capacitor C2, the first node N1 can continue to maintain the low level of the previous phase, so the first control transistor T2 and the output transistor T5 are turned on. Because the first control transistor T2 is turned on, the high-level first clock signal received by the first clock signal terminal CK is transmitted to the second node N2, so that the second node N2 becomes to be at a high level. Therefore, the first noise reduction transistor T6 and the output control transistor T4 are turned off, thereby preventing the high level provided by the first power line VGH from being output to the output terminal GOUT and the first node N1. Meanwhile, because the output transistor T5 is turned on, the output terminal GOUT outputs the low level received by the second clock signal terminal GB at this phase, for example, the low level is used to control the pixel unit 103 as shown in FIG. 1A to work.

In the third phase t3, as shown in FIG. 1C, the first clock signal terminal CK receives the low-level first clock signal, so that the input transistor T1 and the second control transistor T3 are turned on, in this case, the high level provided by the trigger signal line GSTV is transmitted to the first node N1 and the third node N3, therefore the output transistor T5 and the first control transistor T2 are turned off. The second clock signal terminal CB receives a high-level second clock signal, so that the second noise reduction transistor T7 is turned off. Because the second control transistor T3 is turned on, the low level provided by the second power line VGL is transmitted to the second node N2 and stored in the first capacitor C1. Therefore, the output control transistor T4 and the first noise reduction transistor T6 are turned on, and the output terminal GOUT outputs the high level provided by the first power line VGH at this phase.

In the fourth phase t4, as shown in FIG. 1C, the first clock signal terminal CK receives the high-level first clock signal, so that the input transistor T1 and the second control transistor T3 are turned off. The second clock signal terminal CB receives the low-level second clock signal, so that the second noise reduction transistor T7 is turned on. Because of the storage effect of the second capacitor C2, the level of the first node N1 keeps the high level of the previous phase, so that the first control transistor T2 and the output transistor T5 are turned off. Because of the storage effect of the first capacitor C1, the second node N2 continues to maintain the low level of the previous phase, so that the first noise reduction transistor T6 is turned on, so that the high level provided by the first power line VGH is transmitted to the first node N1 and the third node N3 through the turned-on first noise reduction transistor T6 and the turned-on second noise reduction transistor T7, so that the first node N1 and the third node N3 continue to maintain the high level, effectively preventing the output transistor T5 from being turn on, thus avoiding erroneous output.

Figure 1D:
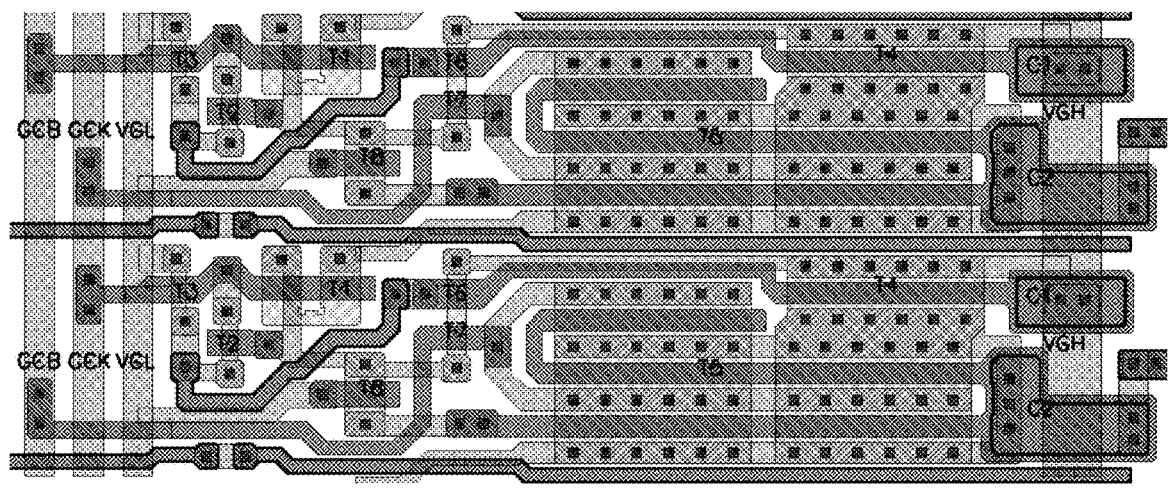
FIG. 1D is a layout schematic diagram of the shift register unit shown in FIG. 1B on a display substrate.

FIG. 1D is a layout schematic diagram of the shift register unit shown in FIG. 1B on a display substrate. As shown in FIG. 1D, the display substrate includes the input transistor T1, . . . , the voltage stabilization transistor T8, the first capacitor C1 and the second capacitor C2 of the shift register unit 104, the first sub-clock signal line GCK and the second sub-clock signal line GCB, the first power line VGH and the second power line VGL.

For example, as shown in FIG. 1D, the input transistor T1 includes a U-shaped active layer and a linear (I-shaped) gate electrode. The linear gate overlaps with two arms of the U-shaped active layer to realize a double-gate transistor, and is horizontally arranged with the first noise reduction transistor T6 and the second noise reduction transistor T7, so that the arrangement takes up a large space in both the horizontal direction and the vertical direction of the display panel. The gate electrode of the voltage stabilization transistor T8 and the first electrode of the second control transistor T3 are space apart from each other at a large distance, and are respectively connected to different positions of the second power line VGL, which increases the complexity of wire arrangement; the node between the first control transistor T2 and the second control transistor T3 is connected to the gate electrode of the first noise reduction transistor T6 through a long connection wire, causing space congestion and so on. Therefore, the arrangement mode and connection mode of the transistors on the display substrate shown in FIG. 1D are easy to cause space congestion, which is not beneficial to realization of a narrow frame design of the display panel, and it is easy to cause signal interference and other problems due to excessive parasitic capacitance caused by unnecessary overlap, which affects the display quality of the display panel.

At least one embodiment of the present disclosure provides a display substrate, comprising: a base substrate, and a shift register unit and a first clock signal line that are on the base substrate, the first clock signal line extends along a first direction on the base substrate and is configured to provide a first clock signal to the shift register unit; the shift register unit comprises an input circuit, an output circuit, a first control circuit and an output control circuit; the input circuit is configured to input an input signal to a first node in response to the first clock signal; the output circuit is configured to output an output signal to an output terminal; the first control circuit is configured to control a level of a second node in response to a level of the first node and the first clock signal; the output control circuit is configured to control a level of the output terminal under control of a level of the second node; the input circuit comprises an input transistor, an active layer of the input transistor is in a strip shape extending along a second direction, and the second direction is different from the first direction; the input transistor comprises a first gate electrode, a second gate electrode and a connection electrode connecting the first gate electrode and the second gate electrode, the connection electrode comprises a first part which is connected to the first gate electrode and extends along the first direction, a second part which is connected to the second gate electrode, and a third part which extends along the second direction and is connected to the first part and the second part, and the third part of the connection electrode is connected to the first clock signal line to receive the first clock signal.

At least one embodiment of the present disclosure provides a display device corresponding to the above-mentioned display substrate, and a manufacturing method of a display substrate.

The display substrate provided by at least one embodiment of the present disclosure, the circuit connection and structural layout of the shift register unit are optimized, and the length of the shift register unit in the second direction is reduced to a certain extent, which is beneficial to realizing the narrow frame design of the display panel and ensuring the display quality of the display panel.

Figure 2A:
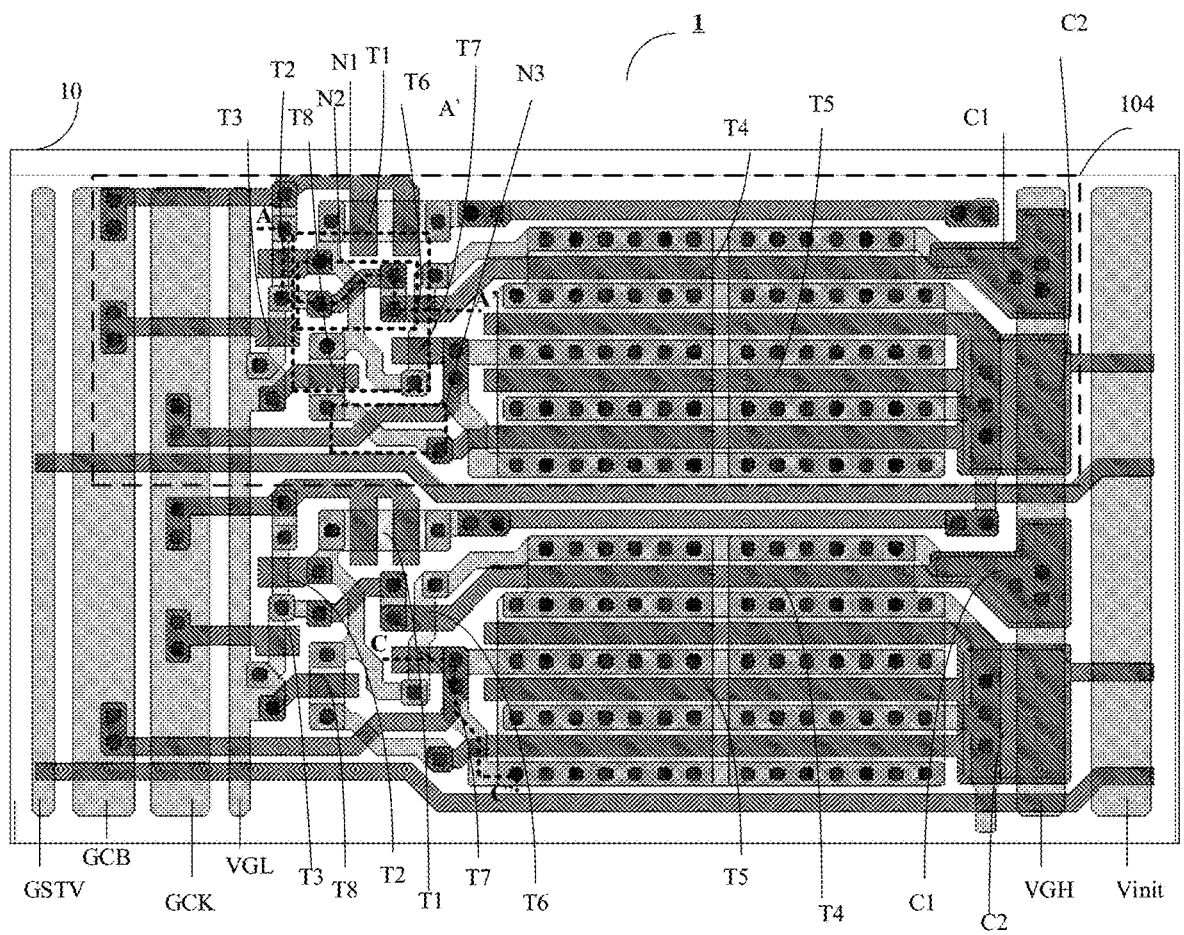
FIG. 2A is a layout schematic diagram of a display substrate provided by at least one embodiment of the present disclosure.

Embodiments of the present disclosure and some examples thereof will be described in detail with reference to the accompanying drawings. At least one embodiment of the present disclosure provides a display substrate. FIG. 2A is a layout schematic diagram of the shift register unit 104 shown in FIG. 1B on the display substrate.

For example, as shown in FIG. 2A, the display substrate 1 includes: a base substrate 10, a shift register unit 104, a first power line VGH, a second power line VGL, and a plurality of clock signal lines (for example, a first sub-clock signal line GCK, a second sub-clock signal line GCB, and a trigger signal line GSTV as shown in the figure) that are arranged on the base substrate 10. For example, the first power line VGH, the second power line VGL, and the plurality of clock signal lines extend along a first direction (e.g., the vertical direction shown in FIG. 2A) on the base substrate 10, and are configured to respectively supply a first voltage, a second voltage, and a plurality of clock signals (e.g., the trigger signal, the first clock signal, or the second clock signal described above, etc.) to the shift register unit 104.

It should be noted that the first power line VGH, the second power line VGL and the plurality of clock signal lines may be arranged in parallel along the first direction, or may cross at a certain angle (for example, less than or equal to 20 degrees), the embodiments of the present disclosure are not limited to this case.

For example, the first power line VGH is configured to provide a first voltage to the plurality of cascaded shift register units 104 included in the scan driving circuit, and the second power line VGL is configured to provide a second voltage to the plurality of cascaded shift register units 104 included in the scan driving circuit. For example, the first voltage is greater than the second voltage, for example, the first voltage is at a DC high level and the second voltage is at a DC low level.

For example, the base substrate 10 may be made of, for example, glass, plastic, quartz or other suitable materials, and the embodiments of the present disclosure are not limited to this case.

For example, the display substrate 1 includes a pixel array region (i.e., the effective display region 102 shown in FIG. 1A, hereinafter referred to as the pixel array region 102) and a peripheral region except the pixel array region. For example, the first power line VGH, the second power line VGL, the plurality of clock signal lines and the shift register unit 104 are in the peripheral region and on a side of the base substrate 10 (as shown in FIG. 1A, between the pixel array region 102 and a side edge of the base substrate), for example, as shown in FIG. 1A, the plurality of clock signal lines and the shift register unit 104 are located on the left side of the base substrate, but may be located on the right side or both of the right side and the left side of the base substrate 10, the embodiments of the present disclosure are not limited to this case.

For example, the second power line VGL and the plurality of clock signal lines are on a side of the shift register unit 104 away from the pixel array region 102, for example, all the second power line VGL and the plurality of clock signal lines are on the left side of the shift register unit 104 shown in FIG. 2A, that is, an orthographic projection of the shift register unit 104 on the base substrate 10 is between the pixel array region 102 and an orthographic projection of a whole of the second power line VGL and the plurality of clock signal lines on the base substrate 10. For example, the first power line VGH is located on a side of the shift register unit 104 close to the pixel array region 102, that is, an orthographic projection of the first power line VGH on the base substrate 10 is between the pixel array region 102 and the orthographic projection of the shift register unit 104 on the base substrate 10.

It should be noted that the above wiring positions are only exemplary, as long as the wiring settings can be satisfied to facilitate the connection with the shift register unit, the embodiments of the present disclosure are not limited to this case.

For example, the pixel array region 102 includes a plurality of pixel units 103 arranged in an array. For example, each of the plurality of pixel units 103 includes a pixel circuit, and may further include a light-emitting element (not shown in the figure).

For example, the plurality of cascaded shift register units 104 constitute a gate driving circuit. For example, output terminals GOUT of the plurality of shift register units 104 are respectively connected to gate scanning signal terminals of the pixel circuits in each row of the pixel array region to provide output signals (e.g., gate scanning signals) to the pixel circuits in each row, thereby driving the light-emitting elements to emit light. For example, the pixel circuit may be a pixel circuit in the art including circuit structures such as 7T1C, 2T1C, 4T2C, 8T2C, etc., which is not described in detail here.

Only a first stage of shift register unit 104 and a second stage of shift register unit 104 in the gate driving circuit are shown in FIG. 2A. For example, as shown in FIG. 2A, a first clock signal terminal CK (as shown in FIG. 1B) of the first stage of shift register unit 104 is connected to the second sub-clock signal line GCB to receive a first clock signal. A second clock signal terminal CB of first stage of shift register unit 104 is connected to a first clock signal line GCK to receive a second clock signal, the first clock signal terminal CK of second stage of shift register unit is connected to the first sub-clock signal line GCK to receive the first clock signal, the second clock signal terminal CB of the second stage of shift register unit is connected to a second sub-clock signal line GCB to receive the second clock signal, and so on, and the first clock terminal CK of an X-th stage of shift register unit 104 (X is an odd number greater than 1) is connected to the second sub-clock signal line GCB to receive the first clock signal, the second clock terminal CB of the X-th stage of shift register unit 104 is connected to the first clock signal GCK to receive the second clock signal, and the first sub-clock signal line GCK of a (X+1)-th stage of shift register unit is connected to the first clock signal terminal CK to receive the first clock signal, and the second clock signal terminal CB of the (X+1)-th stage of shift register unit is connected to the second sub-clock signal line GCB to receive the second clock signal. It should be noted that the connection mode of the respective stages of shift register units and clock signal lines may adopt other connection modes in the art, the embodiments of the present disclosure are not limited to this case. For example, the input terminal of the first-stage of shift register unit 104 is connected to the trigger signal line GSTV to receive the trigger signal as the input signal, while the input terminal of the second-stage of shift register unit 104 is connected to the output terminal GOUT of a previous stage of shift register unit (i.e., the first stage of shift register unit), and the other stages of shift register units are connected in a similar way. The following description takes the structure of the first stage of shift register unit as an example, which is not limited to this case in the embodiments of the present disclosure.

For example, in the example shown in FIG. 2A, because the first clock terminal CK (as shown in FIG. 1B) of the first-stage of shift register unit 104 is connected to the second sub-clock signal line GCB to receive the first clock signal, and the second clock signal terminal CB of the first-stage of shift register unit 104 is connected to the first sub-clock signal line GCK to receive the second clock signal, in this example, the description takes the case that the second sub-clock signal line GCB is used as the first clock signal line and the first sub-clock signal line GCK is used as the second clock signal line as an example, and which is not limited to this case in the embodiments of the present disclosure.

For example, as shown in FIG. 1B, in some examples, the shift register unit 104 includes an input circuit 1041, an output circuit 1043, a first control circuit 1042 and an output control circuit 1044; in other examples, the shift register unit 104 further includes a second control circuit 1045 and a voltage stabilization circuit 1046.

The input circuit 1041 is configured to input an input signal to a first node N1 in response to a first clock signal. For example, the input circuit 1041 is connected to an input terminal IN, the first node N1 and the first clock signal terminal CK, and is configured to be turned on under control of the first clock signal received by the first clock signal terminal CK, so that the input terminal IN is connected to the first node N1, thereby inputting the input signal to the first node N1. For example, the input circuit 1041 is implemented as the above-mentioned input transistor T1, and the connection mode of the input transistor T1 may be referred to the above description, which is not repeated here.

The output circuit 1043 is configured to output an output signal to an output terminal GOUT. For example, the output circuit 1043 is connected to a third node N3, the output terminal GOUT and the second clock signal terminal CB, and is configured to be turned on under control of a level of the third node N3, so that the second clock signal terminal CB is connected to the output terminal GOUT, thereby outputting the second clock signal at the output terminal GOUT, for example, outputting a low level of the second clock signal. For example, the output circuit 1043 is implemented as the output transistor T5 and the second capacitor C2 described above, and the connection mode of the output transistor T5 and the second capacitor C2 may be referred to the above description, which is not repeated here.

The first control circuit 1042 is configured to control the level of a second node N2 in response to the level of the first node N1 and the first clock signal. For example, the first control circuit is connected to the first node N1, the second node N2 and the first clock signal terminal CK, and is configured to be turned on under the control of the level of the first node N1, so that the second node N2 is connected to the first clock signal terminal CK, thereby providing the first clock signal, provided by the first clock signal terminal CK, to the second node N2. For example, the first control circuit 1042 is implemented as the first control transistor T2 and the second control transistor T3 described above, and the connection mode of the first control transistor T2 and the second control transistor T3 may be referred to the above description, which is not repeated here. It should be noted that the first control circuit 1042 is not limited to being connected to the first node N1, and may also be connected to other independent voltage terminals (providing the same voltage as the first node N1) or a separately set circuit that is the same as the input circuit, the embodiments of the present disclosure are not limited to this case. Other circuits of the shift register unit are connected similarly, which is not described here.

The output control circuit 1044 is configured to control the level of the output terminal GOUT under control of the level of the second node N2. For example, the output control circuit 1044 is connected to the second node N2, the first power line VGH and the output terminal GOUT, and is configured to connect the output terminal GOUT with the first power line VGH under the control of the level of the second node N2, so as to output the first voltage, provided by the first power line VGH, to the output terminal GOUT to control the output terminal GOUT to be at a high level, thereby avoiding erroneous output of the shift register unit in a non-output phase. For example, the output control circuit 1044 is implemented as the above-mentioned output control transistor T4 and the first capacitor C1, and the connection mode of the output control transistor T4 and the first capacitor C1 may be referred to the above description, which is not repeated here.

The second control circuit 1045 is connected to the first node N1 and the second node N2, and is configured to control the level of the first node N1 under control of the level of the second node N2 and the second clock signal. The second control circuit 1045 is connected to the first node N1, the second node N2, the first power line VGH and the second clock signal terminal CB, and is configured to be turned on under the control of the level of second node N2 and the second clock signal received by the second clock signal terminal CB, so that the first power line VGH is connected to first node N1, thereby charging the potential of first node N1 to a high level, thus preventing the output circuit 1042 from being turned on in a non-output phase, thus avoiding erroneous output. For example, the second control circuit 1045 is implemented as the first noise reduction transistor T6 and the second noise reduction transistor T7 described above, and the connection mode of the first noise reduction transistor T6 and the second noise reduction transistor T7 may be referred to the above description, and is not described in detail here.

The voltage stabilization circuit 1046 is connected to the first node N1 and the third node N3, and is configured to stabilize the level of the third node N3. For example, the voltage stabilization circuit 1046 is connected to the first node N1, the third node N3 and the second power line VGL, and is configured to be turned on under control of the second voltage provided by the second power line VGL, so that the first node N1 and the third node N3 are connected. For example, the voltage stabilization circuit 1046 is implemented as a voltage stabilization transistor T8, and the detailed description may be referred to the description of the voltage stabilization transistor T8 in FIG. 1B above, and is repeated here.

For example, the voltage stabilization transistor T8 is always turned on under the control of the second voltage provided by the second power line VGL, so that the third node N3 is connected to the first node N1 through the voltage stabilization transistor T8, thereby preventing the level of the third node N3 from leaking through the input transistor T1, the first control transistor T2 and the second noise reduction transistor T7 that are connected to the first node N1, and reducing the stress of the level of the third node N3 on the first control transistor T1, thus contributing to maintaining the level of the third node N3 and enabling the output transistor T5 to be turned sufficiently in the output stage.

Figure 2B:
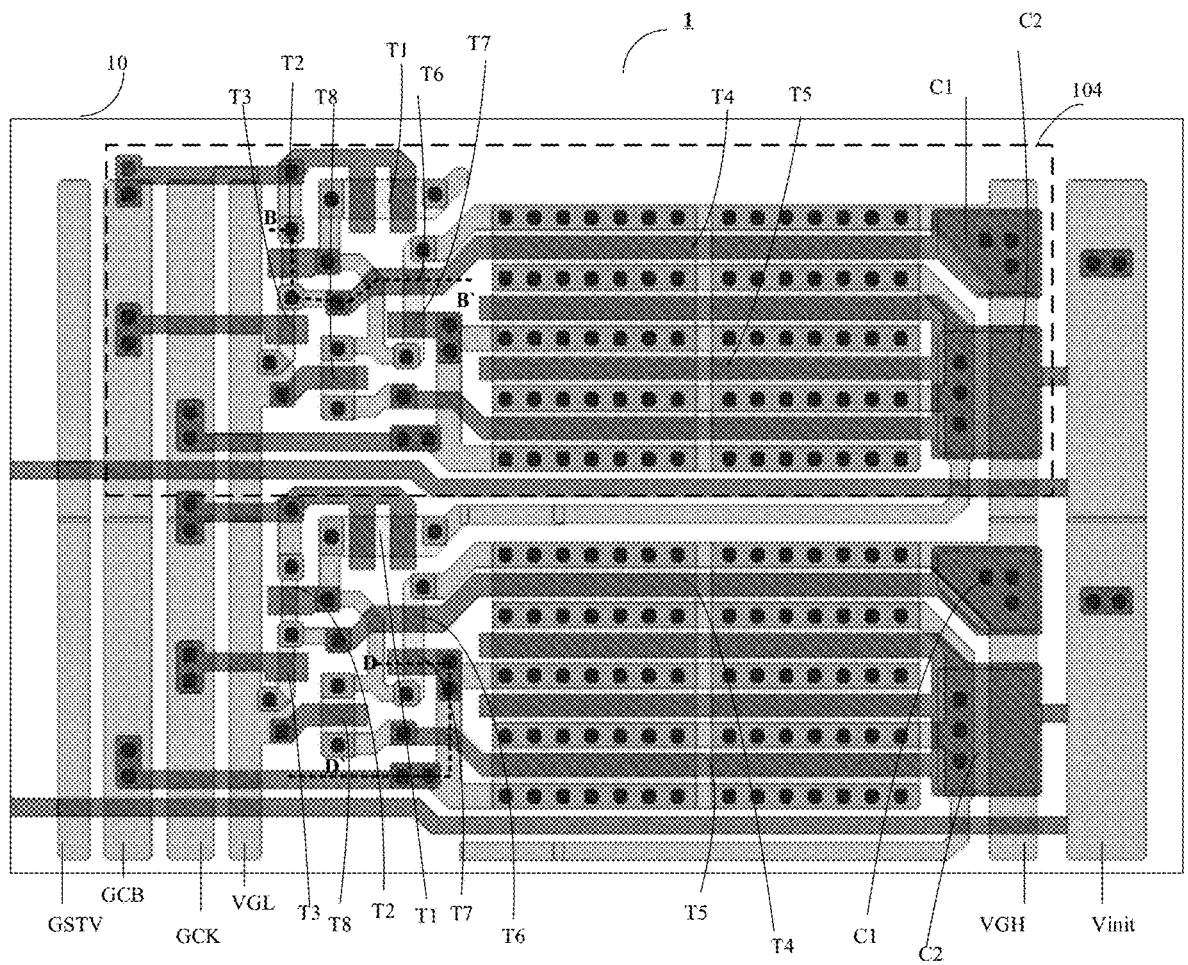
FIG. 2B is a layout schematic diagram of another display substrate provided by at least one embodiment of the present disclosure.
Figure 3A:
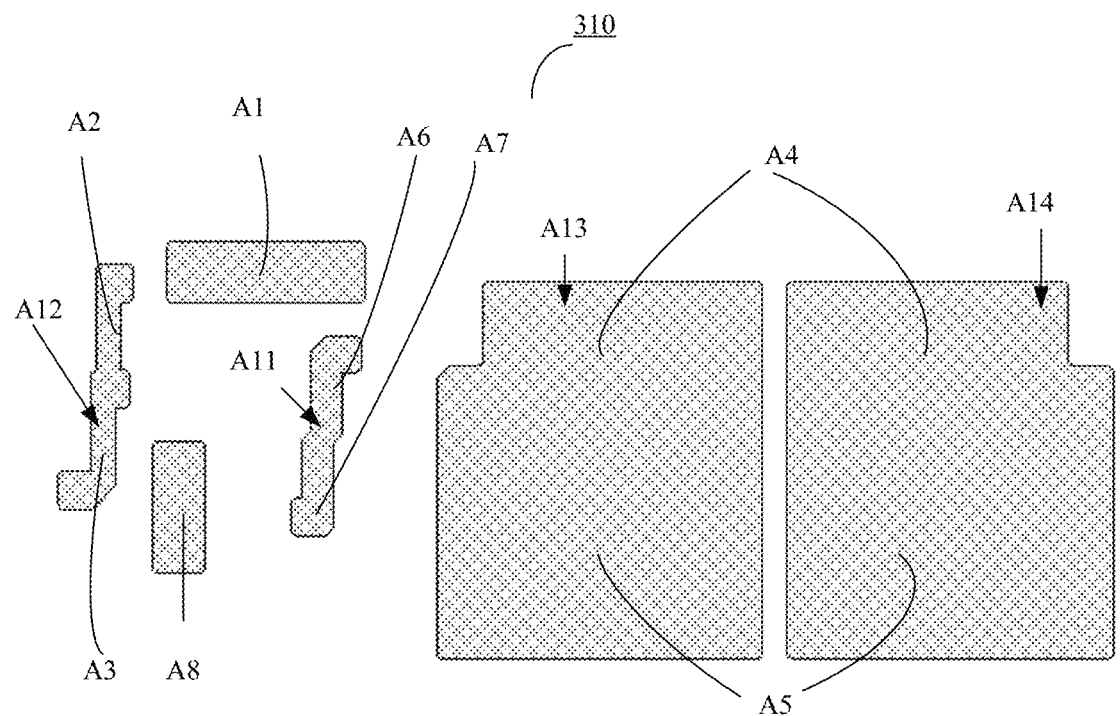
FIG. 3A, FIG. 4A, FIG. 5A and FIG. 6A respectively show planar views of wiring layers of the shift register unit of the display substrate as shown in FIG. 2A.
Figure 3B:
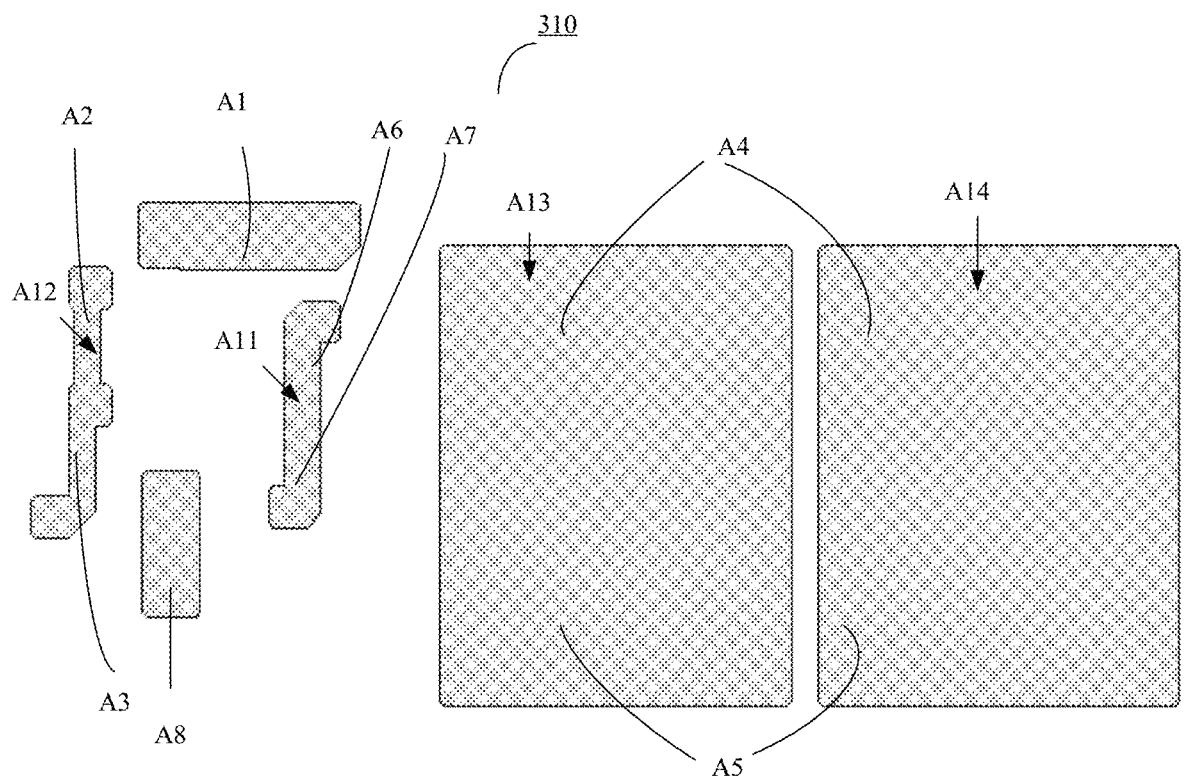
FIG. 3B, FIG. 4B, FIG. 5B, and FIG. 6B respectively show planar views of wiring layers of the shift register unit of the display substrate as shown in FIG. 2B.
Figure 4A:
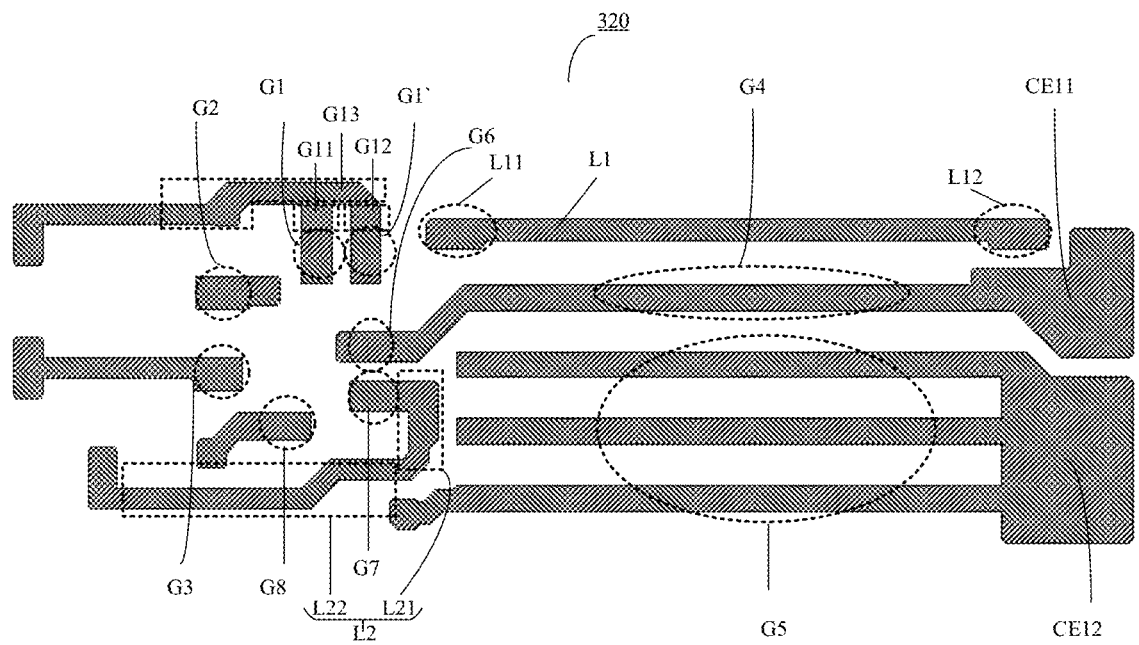
Figure 4B:
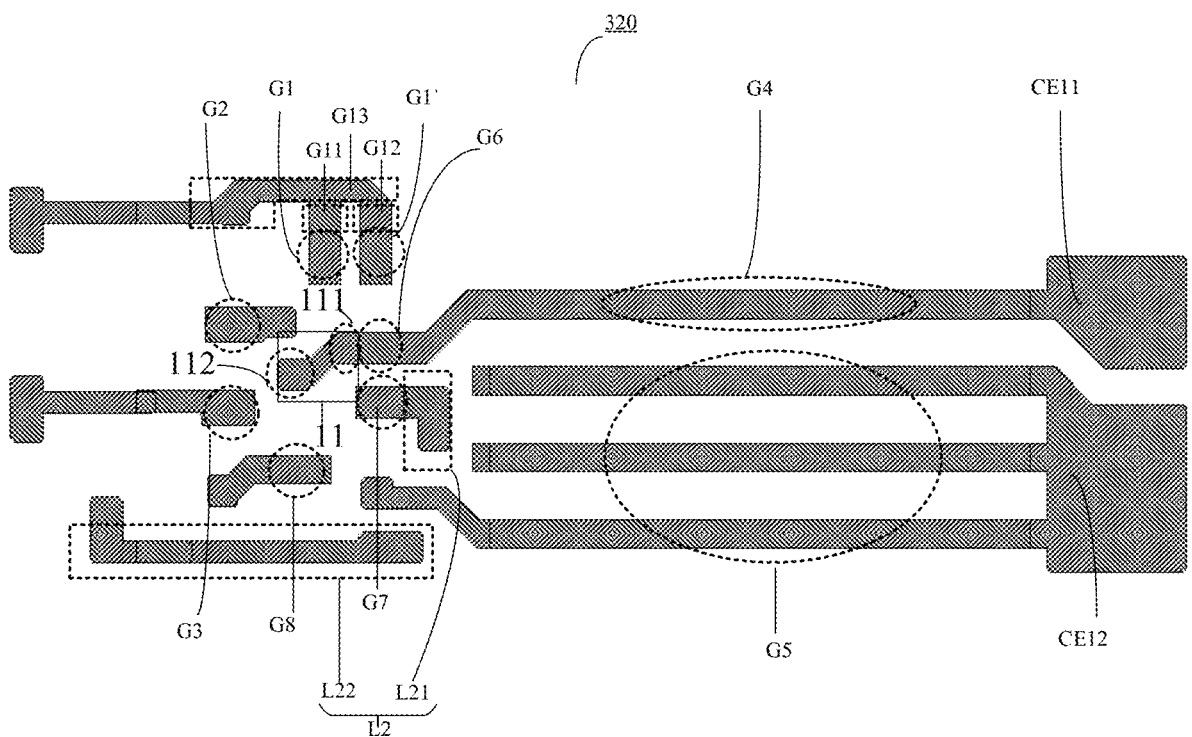
Figure 5A:
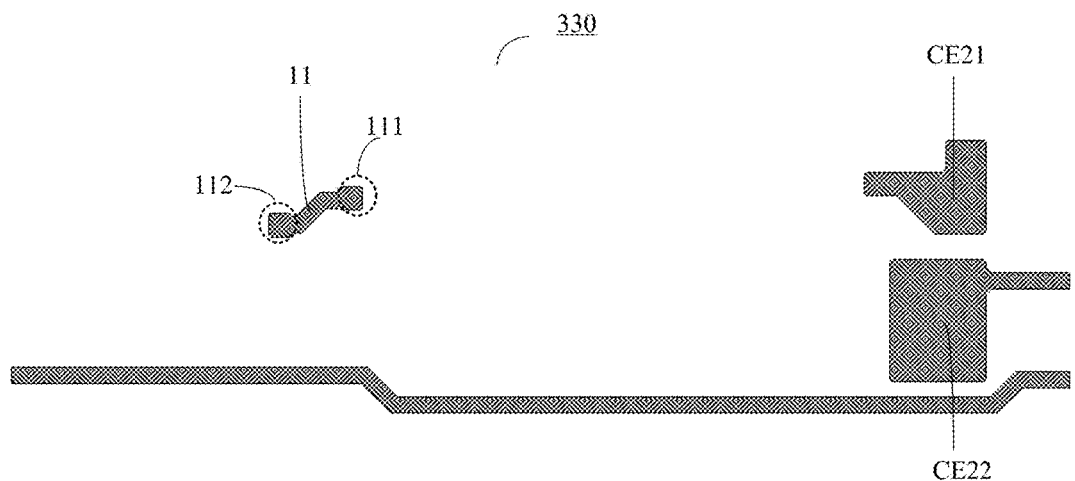
Figure 5B:
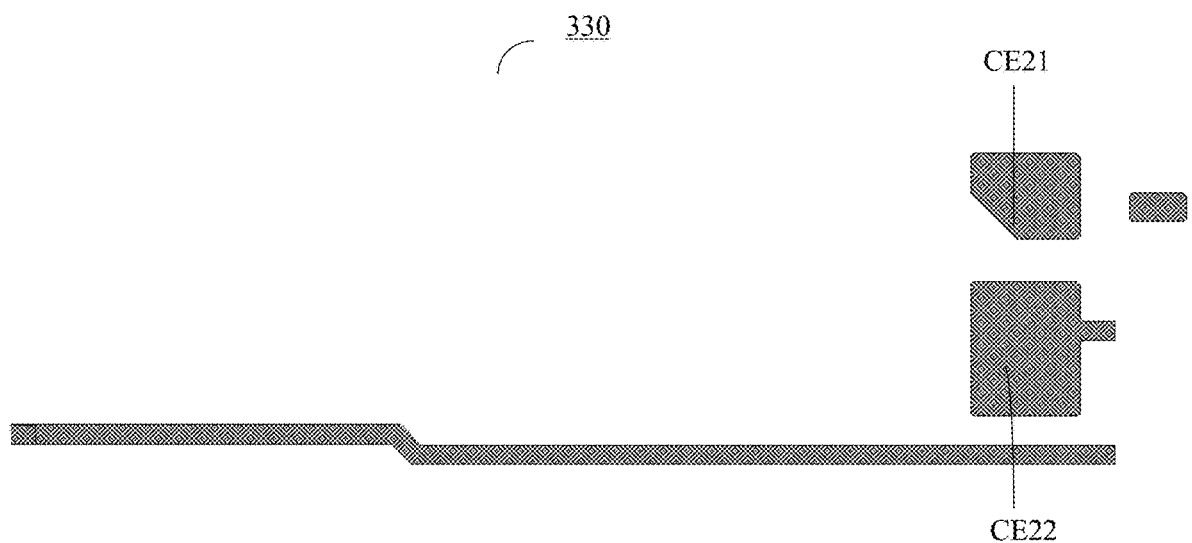
Figure 6A:
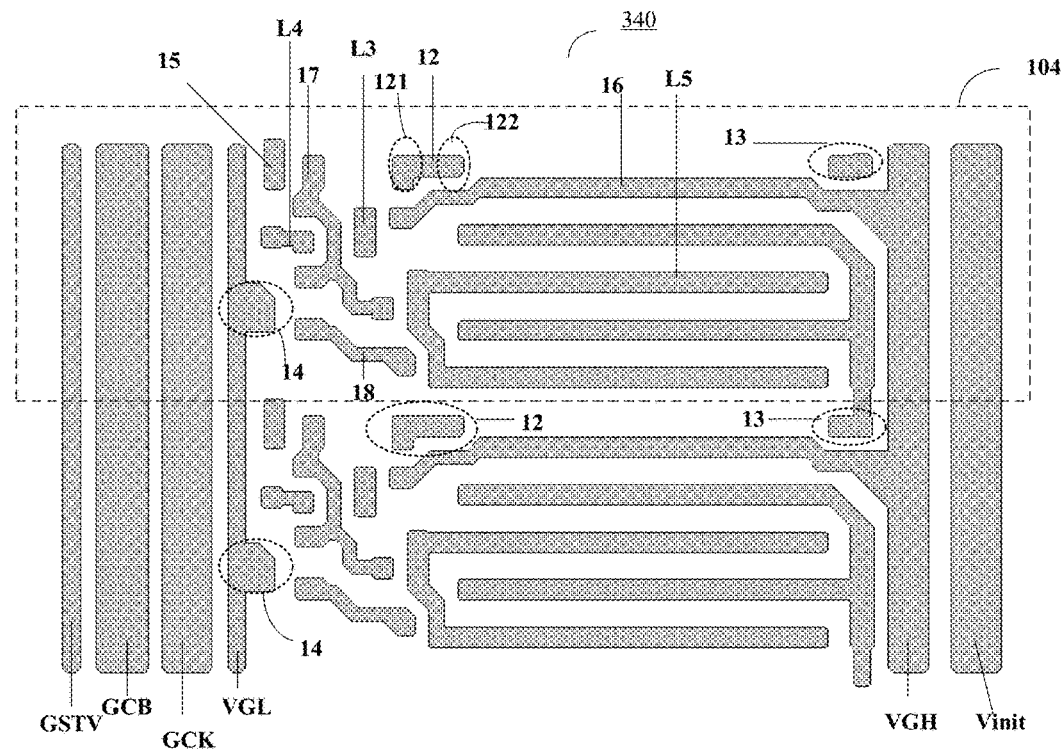
Figure 6B:
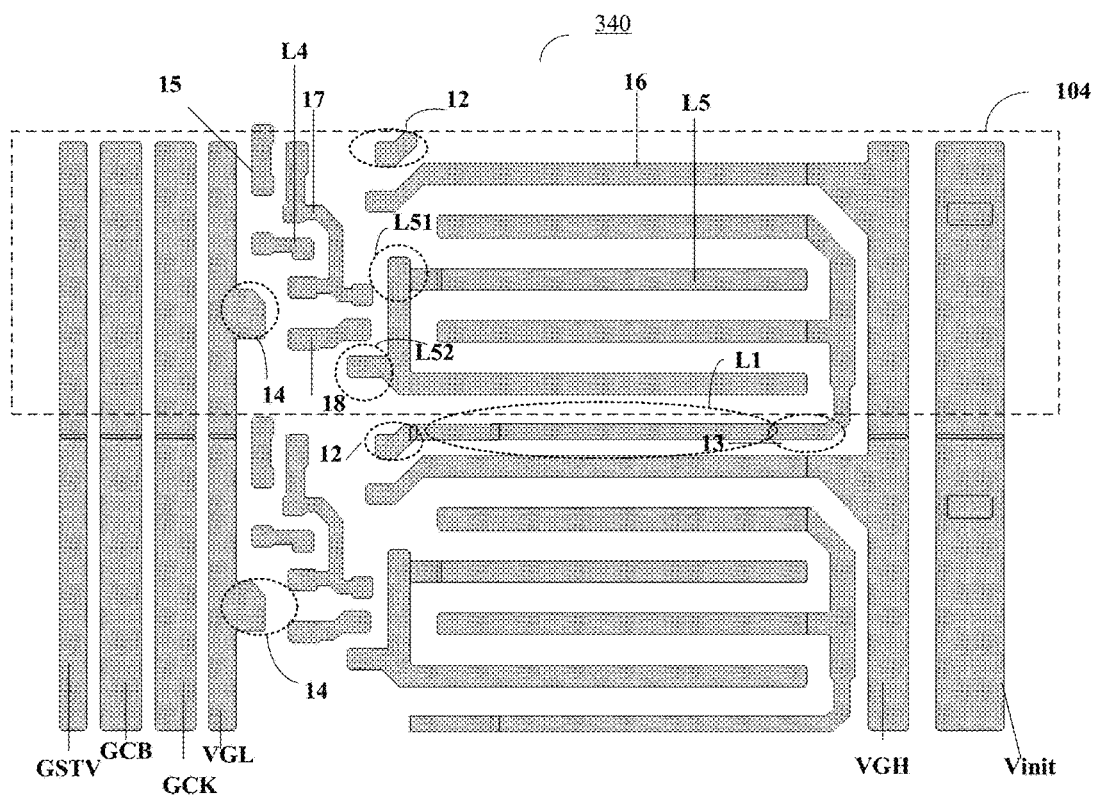
Figure 7A:
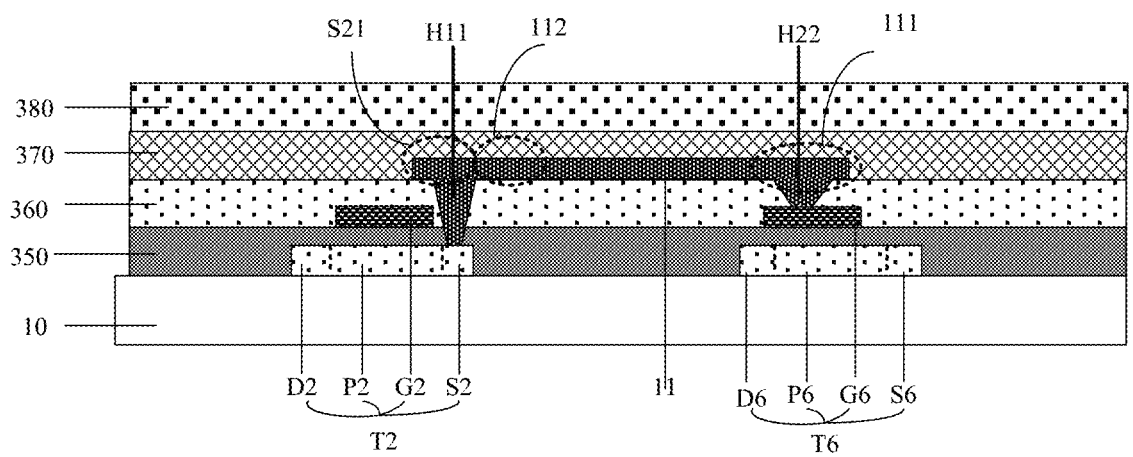
FIG. 7A is a cross-sectional view of an example of the display substrate as shown in FIG. 2A.
Figure 7B:
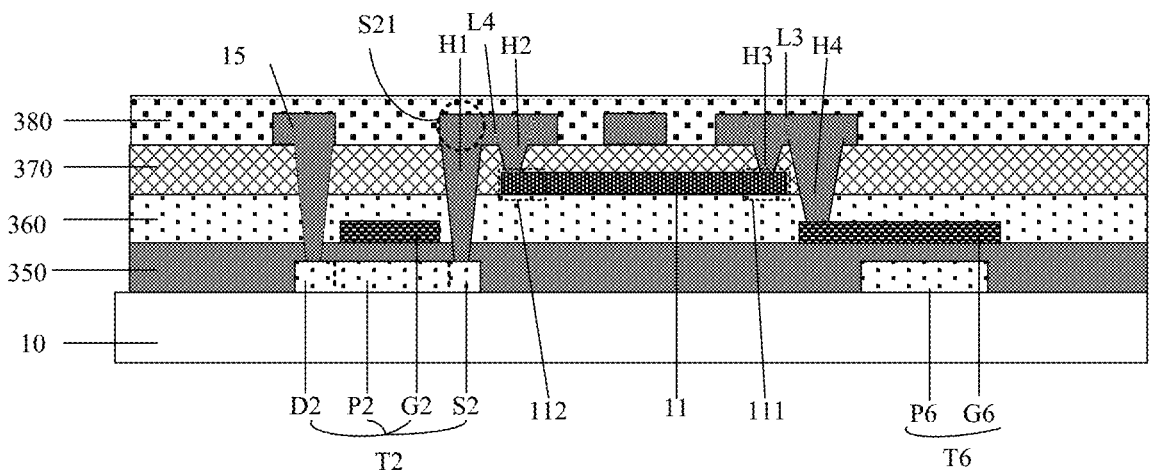
FIG. 7B is a sectional view of some examples of the display substrate as shown in FIG. 2A taken along a direction A-A'.

FIG. 3A, FIG. 4A, FIG. 5A and FIG. 6A respectively show planar views of wiring layers of the shift register unit of the display substrate as shown in FIG. 2A; FIG. 3B, FIG. 4B, FIG. 5B, and FIG. 6B respectively show planar views of wiring layers of the shift register unit of the display substrate as shown in FIG. 2B. FIG. 3A and FIG. 3B are planar views of a semiconductor layer of the display substrate provided by at least one embodiment of the present disclosure, FIG. 4A and FIG. 4B are planar views of a first conductive layer of the display substrate provided by at least one embodiment of the present disclosure, FIG. 5A and FIG. 5B are planar views of a second conductive layer of the display substrate provided by at least one embodiment of the present disclosure, and FIG. 6A and FIG. 6B are planar views of a third conductive layer of the display substrate provided by at least one embodiment of the present disclosure. FIG. 7A is a cross-sectional view of an example of the display substrate as shown in FIG. 2A; FIG. 7B is a sectional view of another example of the display substrate as shown in FIG. 2A taken along a direction A-A'; and FIG. 7C is a sectional view of an example of the display substrate as shown in FIG. 2B taken along a direction B-B'.

For example, an interlayer insulation layer (e.g., including a first insulation layer, a second insulation layer, a third insulation layer, etc.) may be located between the layer structures shown in FIGS. 3A to 6A or FIGS. 3B to 6B. For example, the first insulation layer 350 (as shown in FIG. 7A) is located between the semiconductor layer 310 shown in FIG. 3A and the first conductive layer 320 shown in FIG. 4A or between the semiconductor layer 310 shown in FIG. 3B and the first conductive layer 320 shown in FIG. 4B. The second insulation layer 360 (as shown in FIG. 7A) is located between the first conductive layer 320 shown in FIG. 4A and the second conductive layer 330 shown in FIG. 5A or between the first conductive layer 320 shown in FIG. 4B and the second conductive layer 330 shown in FIG. 5B, and the third insulation layer 370 (as shown in FIG. 7A) is located between the second conductive layer 330 shown in FIG. 5A and the third conductive layer 340 shown in FIG. 6A or between the second conductive layer 330 shown in FIG. 5B and the third conductive layer 340 shown in FIG. 6B.

Figure 7C:
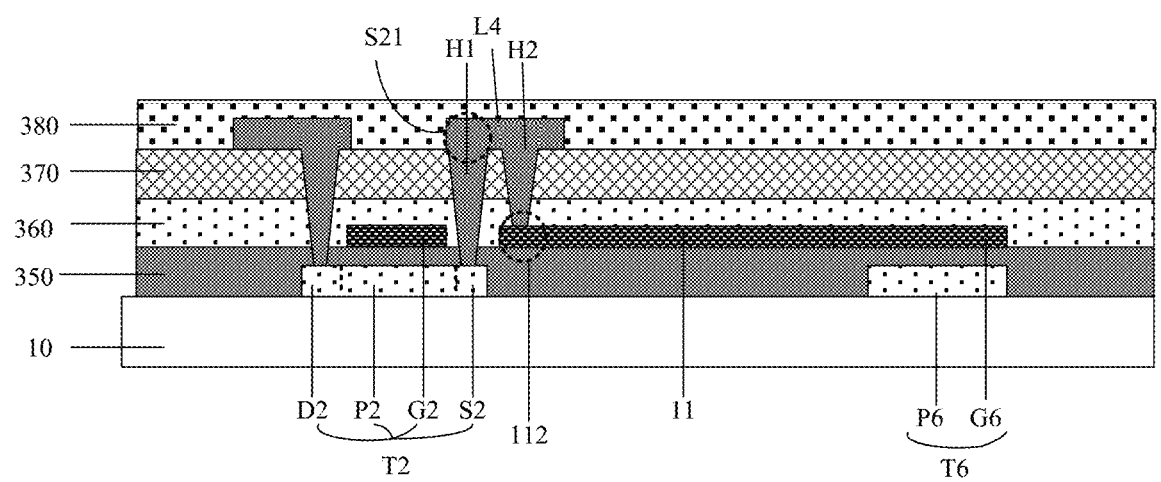
FIG. 7C is a sectional view of some examples of the display substrate as shown in FIG. 2B taken along a direction B-B'.
Figure 7D:
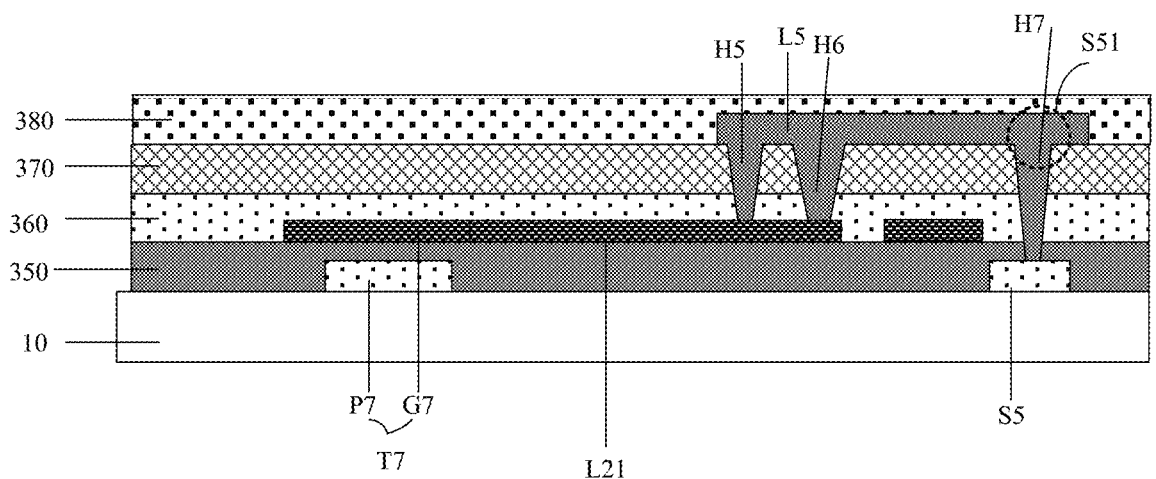
FIG. 7D is a cross-sectional view of some examples of the display substrate as shown in FIG. 2A taken along a direction C-C'.

For example, as shown in FIGS. 7A, 7B and 7C, the display substrate further includes a fourth insulation layer 380, and the fourth insulation layer 380 is on the third conductive layer 340 for protecting the third conductive layer 340.

For example, materials of the first insulation layer 350, the second insulation layer 360, the third insulation layer 370, and the fourth insulation layer 380 may include an inorganic insulation material, such as SiNx, SiOx, and SiNxOy, or an organic insulation material such as organic resin, or other suitable materials, which are not limited by embodiments of the present disclosure.

It should be noted that the display substrate shown in FIG. 2A takes the layout design of the first two stages of shift register units in the scan driving circuit and the first power line, the second power line and the signal line that are connected to the first two stages of shift register units as an example, and the layout embodiments of the other stages of shift register units may be referred to the layout mode shown in FIG. 2A, which is not described in detail here. Of course, other layout modes may also be adopted, which is not limited by the embodiments of the present disclosure. Of course, the rest stages of shift register units of each scan driving circuit may also be referred to the layout shown in FIG. 2A, and other layout forms may also be adopted, the embodiments of the present disclosure are not limited to this case.

The display substrate provided by at least one embodiment of the present disclosure is described in detail with reference to FIGS. 2A-7C.

For example, the active layers of the input transistor T1, . . . , the voltage stabilization transistor T8 of the shift register unit 104 shown in FIG. 2A may be formed on the semiconductor layer 310 shown in FIG. 3A. The active layers of the input transistor T1, . . . , the voltage stabilization transistor T8 of the shift register unit 104 shown in FIG. 2B may be formed on the semiconductor layer 310 shown in FIG. 3B. The semiconductor layer 310 may be formed by performing a patterning process using a semiconductor material. For example, as shown in FIG. 3A and FIG. 3B, the semiconductor layer 310 may be in a shape of a short rod or in a bent shape or in a bent shape with a corner, and may be used to manufacture the active layers of the above-mentioned input transistor T1, . . . , the voltage stabilization transistor T8. Each active layer may include a source region, a drain region, and a channel region located between the source region and the drain region. For example, the channel region has semiconductor characteristics; the source region and the drain region are respectively on two sides of the channel region, and may be doped with impurities, and thus have conductivity. For example, the source region is a part of the active layer, the metal electrode in contact with the source region (e.g., located in the third conductive layer 340) corresponds to the source electrode (or a first electrode) of the respective transistor, the drain region is a part of the active layer, and the metal electrode in contact with the drain region (e.g., located in the third conductive layer 340) corresponds to the drain electrode (or a second electrode) of the respective transistor. For example, the source region is connected to the corresponding metal electrode (the first electrode) through a via hole penetrating the first insulation layer 350, a second insulation layer 360 and a third insulation layer 370, and the drain region is connected to the corresponding metal electrode (the second electrode) through a via hole penetrating the first insulation layer 350, a second insulation layer 360 and a third insulation layer 370.

For example, as shown in FIG. 7A, taking the first control transistor T2 as an example, the active layer of the first control transistor T2 includes a source region S2, a drain region D2 and a channel region P2, and the first control transistor T2 further includes a gate electrode G2, the gate electrode G2 is in the first conductive layer 320; taking the first noise reduction transistor T6 as an example, the active layer of the first noise reduction transistor T6 includes a source region S6, a drain region D6 and a channel region P6, and the first noise reduction transistor T6 further includes a gate electrode G6, the gate electrode G6 is in the first conductive layer 320, and other transistors are similar to this case, and are not described in detail here.

For example, a material of the semiconductor layer 310 may include at least one selected from a group consisting of oxide semiconductor, organic semiconductor, amorphous silicon, polysilicon, etc. For example, the oxide semiconductor includes metal oxide semiconductor (such as indium gallium zinc oxide (IGZO)), and the polysilicon includes low-temperature polysilicon or high-temperature polysilicon, the embodiments of the present disclosure are not limited to this case. It should be noted that the source region and the drain region can be regions doped with N-type impurities or P-type impurities, the embodiments of the present disclosure are not limited to this case.

It should be noted that in other examples, the first electrode and the second electrode of each transistor may be located in other conductive layers, and are connected to the corresponding active layers through via holes in the insulation layer between the first electrode/the second electrode and the semiconductor layer, the embodiments of the present disclosure are not limited to this case.

FIG. 4A and FIG. 4B show the first conductive layer 320 of the display substrate, the first conductive layer 320 is disposed on the first insulation layer so as to be insulated from the semiconductor layer 310. For example, the first conductive layer 320 may include the first electrode CE11 of the first capacitor C1 and the first electrode CE12 of the second capacitor C2, and the gate electrodes of the input transistors T1, . . . , the voltage stabilization transistors T8, and various wires (for example, a first connection wire L1 and a third connection wire L2) directly connected to the gate electrodes, and a connection electrode, and accordingly the first insulation layer also serves as the gate insulation layer. As shown in FIG. 4A, the gate electrodes of the input transistors T1, . . . , the voltage stabilization transistors T8 are parts surrounded by dotted coils, that is, parts where the semiconductor layer structure of each transistor overlaps with the wires in the first conductive layer 320.

As shown in FIG. 4B, the first conductive layer 320 may further include an intermediate transfer electrode 11, for example, in this example, the intermediate transfer electrode 11 is integral with the gate electrode G6 of the first noise reduction transistor T6. For example, in this example, the first connection wire L1 may not be in the first conductive layer 320 shown in FIG. 4B, for example, is in the third conductive layer 340 shown in FIG. 6B, the embodiments of the present disclosure are not limited to this case, as long as the connection between the transistors can be realized.

FIG. 5A and FIG. 5B show the second conductive layer 330 of the display substrate, the second conductive layer 330 includes the second electrode CE21 of the first capacitor C1 and the second electrode CE22 of the second capacitor C2. The second electrode CE21 at least partially overlaps with the first electrode CE11 to form the first capacitor C1, and the second electrode CE22 at least partially overlaps with the first electrode CE12 to form the second capacitor C2. For example, the second conductive layer 330 shown in FIG. 5A further includes the intermediate transfer electrode 11.

For example, the example shown in FIG. 5B is similar to the example shown in FIG. 5A, except that the second conductive layer 330 does not include the intermediate transfer electrode 11, that is, in the display substrate shown in FIG. 2B, the intermediate transfer electrode 11 may not be in the second conductive layer 330, for example, is in the first conductive layer 320 shown in FIG. 4B, the embodiments of the present disclosure are not limited to this case.

FIG. 6A and FIG. 6B show the third conductive layer 340 of the first stage of shift register unit and the second stage of shift register unit of the display substrate, and the third conductive layer 340 includes a plurality of signal lines (e.g., the trigger signal line GSTV, the first sub-clock signal line GCK and the second sub-clock signal lines GCB that are connected to the input terminal of the first-stage of shift register unit 104), the first power line VGH, the second power line VGL, a reference voltage line Vinit, etc. It should be noted that the third conductive layer 340 further includes a first transfer electrode 17, a second transfer electrode 18, a third transfer electrode 16, a signal input electrode 13, a second connection wire (including a first connection sub-wire L3 and a second connection sub-wire L4), a fourth connection wire L5, and so on.

Figure 5C:
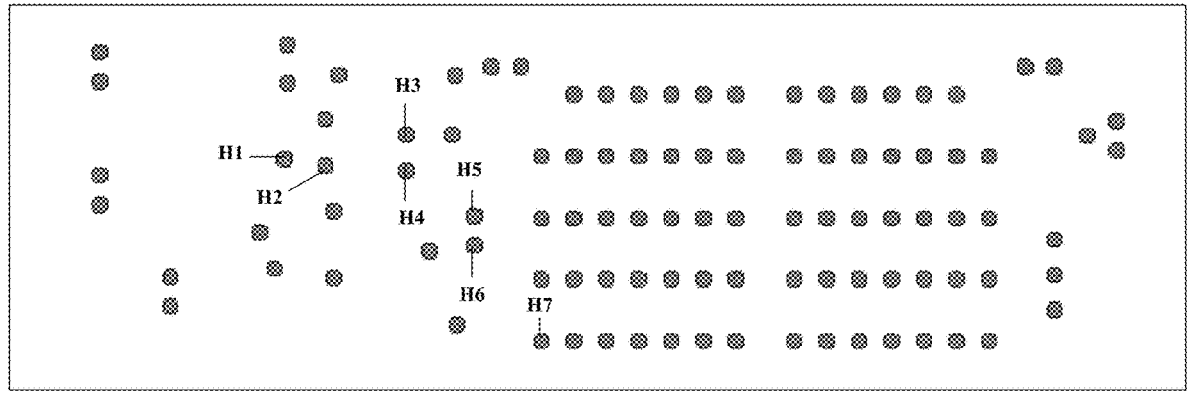
FIG. 5C is a planar view of via holes between the wiring layers of the shift register unit of the display substrate as shown in FIG. 2A.
Figure 5D:
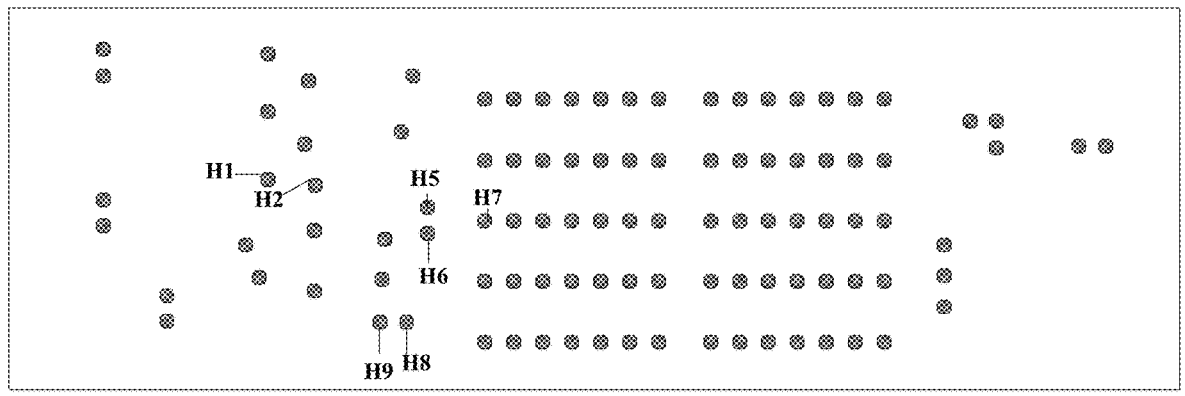
FIG. 5D is a planar view of via holes between the wiring layers of the shift register unit of the display substrate as shown in FIG. 2B.

As shown in FIG. 2A to FIG. 6B, the plurality of signal lines, the first power line VGH and the second power line VGL are connected to transistors and capacitors in other layers required to be connected through at least one via hole as shown in FIG. 5C or FIG. 5D, and the transistors and capacitors are also connected through at least one via hole or bridged by a transition electrode, which is not described in detail here.

For example, a material of the third conductive layer 340 may include titanium, titanium alloy, aluminum, aluminum alloy, copper, copper alloy or any other suitable composite material, the embodiments of the present disclosure are not limited to this case. For example, materials of the first conductive layer 320 and the second conductive layer 330 may be the same as the material of the third conductive layer 340, which is not described in detail here.

FIG. 2A is a schematic diagram of the stacked positional relationship of the semiconductor layer 310 shown in FIG. 3A, the first conductive layer 320 shown in FIG. 4A, the second conductive layer 330 shown in FIG. 5A and the third conductive layer 340 shown in FIG. 6A. FIG. 2B is a schematic diagram of the stacked positional relationship of the semiconductor layer 310 shown in FIG. 3B, the first conductive layer 320 shown in FIG. 4B, the second conductive layer 330 shown in FIG. 5B and the third conductive layer 340 shown in FIG. 6B.

As shown in FIG. 2A, FIG. 3A, FIG. 2B, and FIG. 3B, in at least one example, the active layer of the input transistor T1 is in a strip shape extending along a second direction, and the second direction is different from the first direction. For example, an included angle between the first direction and the second direction is between 70° and 90° which includes 70° and 90°. For example, the included angle between the first direction and the second direction is 70°, 90°, 80°, etc., which can be set according to the actual situation, and the embodiments of the present disclosure are not limited to these cases. For example, in some examples, the channel region of the active layer of the input transistor T1 is I-shaped on the base substrate 10, and a channel length direction of the channel region is the second direction (for example, the transverse direction in the figure) perpendicular to the first direction, of course, the embodiments of the present disclosure are not limited to this case, as long as the length of the display panel in the first direction can be shortened. For example, the channel length direction is a direction in which carriers flow from the first electrode of the input transistor T1 to the second electrode of the input transistor T1; two parallel (and electrically connected to each other, for example) gate electrodes respectively overlap with the strip-shaped active layer (I-shaped active layer) of the input transistor T1, thereby obtaining an I-shaped double-gate transistor. Of course, it is may be that a single gate electrode overlaps with the strip-shaped active layer of the input transistor T1, the embodiments of the present disclosure are not limited to this case.

Because the active layer of the input transistor T1 (it should be noted that the overall shape of the active layer of the input transistor T1) is changed from the U-shaped structure shown in FIG. 1D to a strip shape extending along the second direction (for example, an I-shaped structure extending along the second direction, for example, a structure in a shape of "—"), so that the length of the display panel in the first direction can be shortened, that is, the vertical height of the display panel, which is beneficial to the arrangement of other transistors under the input transistor T1.

For example, as shown in FIG. 3A or FIG. 3B, the active layer of the first noise reduction transistor T6 and the active layer of the second noise reduction transistor T7 are constituted by a continuous noise reduction semiconductor layer A11 (that is, the active layer of the first noise reduction transistor T6 and the active layer of the second noise reduction transistor T7 are integral), and the continuous noise reduction semiconductor layer A11 extends along the first direction and is arranged side by side with the active layer of the input transistor T1 in the first direction. For example, the active layer of the input transistor T1 is on an imaginary line on which the active layer of the first noise reduction transistor T6 and the active layer of the second noise reduction transistor T7 extend along the first direction.

For example, as shown in FIGS. 2A, 2B and 3A, the active layer of the first noise reduction transistor T6 may partially overlap (as shown in FIG. 2A and FIG. 3A) with or completely overlap (as shown in FIG. 2B and FIG. 3B) with the active layer of the second noise reduction transistor T7 in the first direction, that is, the active layer of the first noise reduction transistor T6 may be on an imaginary line on which the active layer of the second noise reduction transistor T7 extends along the first direction. The active layer of the first noise reduction transistor T6 may not overlap with the active layer of the second noise reduction transistor T7 in the first direction, for example, as shown in FIG. 2A and FIG. 3A, the active layer of the first noise reduction transistor T6 may also be offset from the active layer of the second noise reduction transistor T7 by a certain distance in the first direction, as long as the arrangement of other structures is not affected and the width of the shift register unit is excessively increased, and as long as the first noise reduction transistor T6 and the second noise reduction transistor T7 are located below the input transistor T1 in the first direction, no limitation is imposed to this in the embodiments of the present disclosure.

In the embodiment of the present disclosure, the input transistor T1, the first noise reduction transistor T6 and the second noise reduction transistor T7 are changed from the horizontally arranged structure in FIG. 1D to the vertically listed structure, which can reduce the width of the peripheral region of the display panel along the second direction, for example, the horizontal width shown in FIG. 1A, which is beneficial to the realization of the narrow frame design of the display panel.

For example, the gate electrode of the first noise reduction transistor T6 and the gate electrode of the second noise reduction transistor T7 extend along the second direction and are arranged side by side in the first direction. For example, the gate electrode of the first noise reduction transistor T6 and the gate electrode of the second noise reduction transistor T7 may be parallel with each other, for example, both extends along the second direction, or the extension direction of the gate electrode of the first noise reduction transistor T6 and the extension direction of the gate electrode of the second noise reduction transistor T7 may not be parallel with each other, for example, intersect with each other at a certain intersection angle, for example, the intersection angle is less than or equal to 20°, or an angle between the two and a horizontal line is less than or equal to 20°, the embodiments of the present disclosure are not limited to this case, as long as the first noise reduction transistor T6 and the second noise reduction transistor T7 are integrally provided and arranged up and down along the first direction.

For example, the first electrode of the input transistor T1, the gate electrode of the first control transistor T2, the first electrode of the second noise reduction transistor T7 and the below-described second electrode of the voltage stabilization transistor T8 are all connected to the first node N1. For example, the first electrode of the input transistor T1, the gate electrode of the first control transistor T2, and the first electrode of the second noise reduction transistor T7 are connected through via holes. The second node N2 is connected to the gate electrode of the first noise reduction transistor T6, the gate electrode of the output control transistor T4, the first electrode of the first control transistor T2, the first electrode of the first capacitor C1 and the first electrode of the second control transistor T3. For example, as shown in FIG. 2A, the gate electrode of the first noise reduction transistor T6, the gate electrode of the output control transistor T4, the first electrode of the first control transistor T2, the first electrode of the first capacitor C1 and the first electrode of the second control transistor T3 are connected through via holes. The third node N3 is connected to the first electrode of the voltage stabilization transistor T8, the gate electrode of the output transistor T5 and the first electrode of the second capacitor C2. For example, the first electrode of the voltage stabilization transistor T8, the gate electrode of the output transistor T5 and the first electrode of the second capacitor C2 are connected through via holes.

For example, as shown in FIG. 6A, the shift register unit further includes a first transfer electrode 17, a second transfer electrode 18 and a third transfer electrode 16.

For example, the first transfer electrode 17 is connected to the first electrode of the input transistor T1, the gate electrode of the first control transistor T2, the second electrode of the voltage stabilization transistor T8, and the first electrode of the second noise reduction transistor T7. For example, the first transfer electrode 17 is connected to the gate electrode of the first control transistor T2 through a via hole penetrating through the second insulation layer 360 and the third insulation layer 370, the first transfer electrode 17 is in a same layer as the first electrode of the input transistor T1, the second electrode of the voltage stabilization transistor T8, and the first electrode of the second noise reduction transistor T7 (for example, all in the third conductive layer 340) and is integral with the first electrode of the input transistor T1, the second electrode of the voltage stabilization transistor T8, and the first electrode of the second noise reduction transistor T7. For example, the first node N1 includes a first transfer electrode 17, that is, the first transfer electrode 17 serves as the first node N1 which connects the corresponding electrodes of the input transistor T1, the first control transistor T2, the voltage stabilization transistor T8 and the second noise reduction transistor T7.

For example, the first transfer electrode 17 is a fold line which is between the group of the first control transistor T2, the second control transistor T3, the voltage stabilization transistor T8, and the group of the first noise reduction transistor T6 and the second noise reduction transistor T7, and extends along the first direction in a bent shape, and a starting point of the first transfer electrode 17 is the first electrode of the input transistor T1, and an ending point of the first transfer electrode 17 is the first electrode of the second noise reduction transistor T7. Because the first noise reduction transistor T6 and the second noise reduction transistor T7 are arranged side by side with the input transistor T1 along the first direction, and the first control transistor T2 and the second control transistor T3 are also arranged side by side along the first direction, that is, a distance between a whole of the first noise reduction transistor T6 and the second noise reduction transistor T7 and a whole of the first control transistor T2 and the second control transistor T3 is small, so that an extension length of the first transfer electrode 17 in the first direction is larger than an extension length of the first transfer electrode 17 in the second direction, thus shortening the length of the first transfer electrode 17 connecting these transistors and the width of the first transfer electrode 17 in the second direction, which is beneficial to the realization of a narrow frame.

For example, the second transfer electrode 18 is connected to the first electrode of the voltage stabilization transistor T8 and the gate electrode of the output transistor T5. For example, the second transfer electrode 18 is connected to the gate electrode of the output transistor T5 through a via hole penetrating through the second insulation layer 360 and the third insulation layer 370, and the second transfer electrode 18 and the first electrode of the voltage stabilization transistor T8 are in a same layer (for example, both are in the third conductive layer 340) and are integral. For example, the third node N3 includes the second transfer electrode 18, that is, the second transfer electrode 18 serves as the third node N3 which connects the voltage stabilization transistor T8 and the output transistor T5.

For example, as shown in FIG. 4A, the input transistor T1 includes a first gate electrode G1, a second gate electrode G1', and connection electrodes (G11-G13) connecting the first gate electrode G1 and the second gate electrode G1'. The connection electrodes (G11-G13) are in a same layer as the first gate electrode G1 and the second gate electrode G1', and include a first part G11 that extends along the first direction (e.g., the vertical direction as shown in FIG. 4A) and is connected to the first gate electrode G1, and a second part G12 connected to the second gate electrode G1', and a third part that extends along the second direction (e.g., the horizontal direction as shown in FIG. 4A) and connects the first part G11 and the second part G12, the first gate electrode G1 and the second gate electrode G1' of the input transistor T1 are connected to a first clock signal line providing the first clock signal through the third part G13 of the connection electrode to receive the first clock signal.

For example, the first gate electrode G1 and the second gate electrode G1' are first connected together by the connection electrodes (G11-G13), and then connected to the first clock signal line. For example, the gate electrode of the input transistor T1 and the gate electrode of the second control transistor T3 may also be connected together and integrally connected to the first clock signal line, for example, the connection mode shown in FIG. 1D is adopted, the embodiments of the present disclosure are not limited to this case.

For example, as shown in FIG. 2A, for the first-stage of shift register unit, the first clock signal line providing the first clock signal is the second sub-clock signal line GCB, and for the second stage of shift register unit, the first clock signal line providing the first clock signal is the first sub-clock signal line GCK, the embodiments of the present disclosure are not limited to this case.

For example, in some examples, the second electrode of the active layer of the first control transistor T2 may be directly connected to the second sub-clock signal line GCB through a wire. For example, as shown in FIG. 6A, in some other examples, the shift register unit further includes a transfer electrode 15. In this example, the second electrode of the first control transistor T2 is not directly connected to the second sub-clock signal line GCB through a wire, but may be connected to the third part G13 of the connection electrode through the transfer electrode 15 to be connected to the second sub-clock signal line GCB at the same time as the third part G13 of the connection electrode to receive the first clock signal. Embodiments of the present disclosure are not limited to this case.

For example, the active layer of the input transistor T1 is connected to the signal input electrode through the first connection wire L1 extending along the second direction to receive the input signal; the signal input electrode serves as the input terminal IN of the shift register unit 104, for example, is the signal input electrode 13 located in the third conductive layer shown in FIG. 6A. For example, the signal input electrode 13 may be a separately provided electrode, for example, as shown in the third conductive layer of the first stage of shift register unit shown in FIG. 6A, or an extension region of the second electrode of the output transistor T5 (the second electrode of the output transistor T5 serves as the output terminal GOUT of the output circuit 1043) serves as the signal input electrode 13, for example, the second electrode of the output transistor T5 of the current stage of shift register unit (i.e., the metal electrode connected to the drain region of the active layer of the output transistor T5) serves as the output terminal GOUT of the output circuit 1043, and is connected to the signal input electrode of a next stage of shift register unit (e.g., the second stage of shift register unit) adjacent to the shift register unit (e.g., the first stage of shift register unit) to serves as the input signal of the next stage of shift register unit, the embodiments of the present disclosure are not limited to this case.

For example, as shown in FIG. 2A, FIG. 4A and FIG. 6A, the shift register unit further includes a wire transfer electrode 12. For example, the wire transfer electrode 12 is in the third conductive layer 340. For example, the wire transfer electrode 12 and the active layer of the input transistor T1 are located in different layers, for example, the first electrode of the input transistor T1 is electrically connected to a first end 121 of the wire transfer electrode 12, for example, the first electrode of the input transistor T1 is located in a same layer as the wire transfer electrode 12 and is integral with the wire transfer electrode 12. For example, the source region of the active layer of the input transistor T1 is connected to the first electrode of the input transistor T1 through a via hole penetrating through the first insulation layer 350, the second insulation layer 360 and the third insulation layer 370, a second end 122 of the wire transfer electrode 12 is connected to a first end L11 of a first connection wire L1 (located in the first conductive layer 320 shown in FIG. 4A), that extends along the second direction and is in a different layer from the wire transfer electrode 12, through a via hole penetrating the second insulation layer 360 and the third insulation layer 370, and a second end L12, which extends along the second direction, of the first connection wire L1 is connected to the signal input electrode 13 (located in the third conductive layer 340) that is in a different layer from the first connection wire L1 through a via hole penetrating the second insulation layer 360 and the third insulation layer 370, so as to realize the connection between the input transistor T1 and the input terminal IN. For example, the wire transfer electrode 12 and the signal input electrode 13 are in a same layer.

For example, as shown in FIG. 2B and FIG. 6B, the first connection wire L1 may also be formed in the third conductive layer 340, and directly connected to the wire transfer electrode 12 and the signal input electrode 13 (i.e., not connected through a via hole), that is, integral with the wire transfer electrode 12 and the signal input electrode 13, the embodiments of the present disclosure are not limited to this case, as long as the connection between the input transistor T1 and the signal input electrode 13 can be realized.

For example, in some embodiments of the present disclosure, the active layer of the first control transistor T2 and the active layer of the second control transistor T3 are formed by a continuous control semiconductor layer A12, and the control semiconductor layer A12 extends along the first direction, and the gate electrode of the first control transistor T2 and the gate electrode of the second control transistor T3 extend along the second direction and overlap with each other in the first direction, that is, the gate electrode of the first control transistor T2 and the gate electrode of the second control transistor T3 are arranged up and down along the first conductive layer 320. It should be noted that A11 and A12 are named as different semiconductor layers for clarity and conciseness, but the noise reduction semiconductor layer A11 and the control semiconductor layer A12 are both located in the same semiconductor layer 330 shown in FIG. 3A or FIG. 3B.

For example, as shown in FIG. 2A and FIG. 4A, an orthographic projection of the second control transistor T3 on the base substrate 10 and an orthographic projection of the first control transistor T2 on the base substrate 10 are respectively located on two sides of a second connection sub-wire L4 in the first direction. Of course, the extension direction of the gate electrode of the first control transistor T2 and the extension direction of the gate electrode of the second control transistor T3 may not be parallel with each other, for example, intersect at a certain angle, for example, an intersection angle of the two is less than or equal to 20°, or each of angles respectively between the two and the horizontal line is less than or equal to 20°, the embodiments of the present disclosure are not limited to this case.

For example, as shown in FIGS. 2A and 2B, 3A and 3B, the active layer of the first control transistor T2 may partially overlap (as shown in FIGS. 2A and 3A) or completely overlap (not shown in the figure) with the active layer of the second control transistor T3 in the first direction, that is, the active layer of the first control transistor T2 may be on an imaginary line on which the active layer of the second control transistor T3 extends along the first direction. The active layer of the first control transistor T2 may not overlap with the active layer of the second control transistor T3 in the first direction, for example, as shown in FIGS. 2A and 3A, the active layer of the first control transistor T2 is offset from the active layer of the second control transistor T3 by a certain distance in the first direction as long as the arrangement of other structures is not affected and the width of the shift register unit is excessively increased, and as long as the active layer of the first control transistor T2 and the active layer of the second control transistor T3 are located below the input transistor T1 in the first direction, the embodiments of the present disclosure are not limited to this case.

For example, the active layer of the first control transistor T2, the active layer of the second control transistor T2, and the active layer of the input transistor T1 are arranged side by side in the second direction. For example, in some examples, the active layer of the first control transistor T2 and the active layer of the second control transistor T3 intersect with an imaginary line on which the active layer of the input transistor T1 extend along the second direction. That is, the active layer of the first control transistor T2 and the active layer of the second control transistor T3 are on an imaginary line on which the active layer of the input transistor T1 extends along the second direction. For example, in the embodiments of the present disclosure, no limitation is imposed to transistors other than the first control transistor T2 and the second control transistor T3 in the shift register unit as long as the connection relationship of the circuits can be satisfied.

Therefore, in the embodiments of the present disclosure, the arrangement mode of the first control transistor T2 and the second control transistor T3 is changed from the structure arranged left and right along the second direction shown in FIG. 1D to the structure arranged up and down along the first direction, which can reduce the horizontal width of the peripheral region of the display panel and the distance between the transistors to the signal line and the second power line, thus facilitating the realization of the narrow frame design of the display panel.

For example, in some embodiments of the present disclosure, the active layer of the input transistor T1 is further on an imaginary line on which the active layer of the first noise reduction transistor T6 and the active layer of the second noise reduction transistor T7 extend along the first direction, a whole of the active layer of the first control transistor T2 and the active layer of the second control transistor T3 a whole of the active layer of the first noise reduction transistor T6 and the active layer of the second noise reduction transistor T7 are oppositely arranged side by side in the second direction, thus reducing a distance between a whole of the active layer of the first control transistor T2 and the active layer of the second control transistor T3 and a whole of the active layer of the first noise reduction transistor T6 and the active layer of the second noise reduction transistor T7.

For example, in some examples, the shift register unit further includes an intermediate transfer electrode 11. The gate electrode of the first noise reduction transistor T6 is connected to the first electrode of the first control transistor T2 and the first electrode of the second control transistor T3 through the intermediate transfer electrode 11 that is in the second conductive layer 330 shown in FIG. 5A and the second connection sub-wire L4 in FIG. 6A, that is, the gate electrode of the first noise reduction transistor T6 is connected to a part between the active layer of the first control transistor T2 and the active layer of the second control transistor T3. An orthographic projection of the intermediate transfer electrode 11 on the base substrate 10 does not overlap with that of the active layer of the first control transistor T2 and the active layer of the second control transistor T3 in the first direction, that is, the orthographic projection of the intermediate transfer electrode 11 on the base substrate 10 is between the orthographic projection of the active layer of the first control transistor T2 and of the active layer of the second control transistor T3 on the base substrate 10 and an orthographic projection of the first noise reduction transistor T6 on the base substrate 10.

Therefore, in the embodiment of the present disclosure, the arrangement mode of the first control transistor T2 and the second control transistor T3 is changed from the structure arranged left and right in the second direction shown in FIG. 1D to the structure arranged up and down in the first direction shown in FIG. 2A, and the arrangement mode and positions of the input transistor T1, the first noise reduction transistor T6 and the second noise reduction transistor T7 are also changed to a structure arranged up and down in the first direction, thereby shortening the distance between the orthographic projection of the first noise reduction transistor T6 on the base substrate 10 and the orthographic projection of the first control transistor T2 and the second control transistor T3 on the base substrate 10, greatly shortening the length of the wire connecting the gate electrode of the first noise reduction transistor T6 with the first control transistor T2 and the second control transistor T3 (i.e., the intermediate transfer electrode 11), and largely optimizing the problem of space congestion caused by dense and long wires.

For example, in some examples, the connection mode of the intermediate transfer electrode 11 is as shown in FIG. 7A or FIG. 7B. For example, in this example, the intermediate transfer electrode 11 is in the second conductive layer 11. For example, as shown in FIG. 7A, the first insulation layer 350 is located between the active layer of the first noise reduction transistor T6 (for example, in the semiconductor layer 310 including the source region S6, the drain region D6 and the channel region P6) and the gate electrode G6 of the first noise reduction transistor T6 in the direction perpendicular to the base substrate 10; the second insulation layer 360 is located between the gate electrode G6 of the first noise reduction transistor T6 and the intermediate transfer electrode 11 in the direction perpendicular to the base substrate 10.

For example, as shown in FIG. 7A, in some examples, the gate electrode of the first noise reduction transistor T6 is connected to a first end 111 of the intermediate transfer electrode 11 through a via hole H22 penetrating the second insulation layer 360, the first electrode S21 of the first control transistor T2 is in a same layer as the intermediate transfer electrode 11, and is connected to a second end 112 of the intermediate transfer electrode 11, that is, the intermediate transfer electrode 11 is integral with the first electrode S21 of the first control transistor T2, thus realizing the connection between the gate electrode of the first noise reduction transistor T6 and the first electrode of the first control transistor T2. The first electrode S21 of that first control transistor T2 is connected to the source region S2 of the active layer of the first control transistor T2 (i.e., the first electrode of the first control transistor T2) through a via hole H11 passing through the first insulation layer 350 and the second insulation layer 360. For example, in some examples, the second node N2 includes the intermediate transfer electrode 11. It should be noted that, for the sake of clarity and conciseness, FIG. 7A only shows that the first electrode S21 of the first control transistor T2 is connected to the second end 112 of the intermediate transfer electrode 11, because the first electrode of the first control transistor T2 is connected to the first electrode of the second control transistor T3, the first electrode of the second control transistor T3 is also connected to the second end 112 of the intermediate transfer electrode 11, which is not limited by the embodiments of the present disclosure. The following embodiments are the same and are not described again.

For example, as shown in FIGS. 5C and 7B, in other examples, the shift register unit 104 further includes a second connection wire, for example, the second connection wire includes a first connection sub-wire L3 and a second connection sub-wire L4. For example, the third insulation layer 370 is located between the intermediate transfer electrode 11 and the second connection wire L3/L4 in the direction perpendicular to the base substrate 10.

For example, the gate electrode G6 of the first noise reduction transistor T6 is connected to the first connection sub-wire L3 through a via hole H4 penetrating the second insulation layer 360 and the third insulation layer 370, and the first end 111 of the intermediate transfer electrode 11 is connected to the first connection sub-wire L3 through a via hole H3 penetrating the third insulation layer 370.

For example, the source region S2 of the active layer of the first control transistor T2 is connected to the first electrode S21 of the first control transistor T2 through a via hole H1 penetrating through the first insulation layer 350, the second insulation layer 360 and the third insulation layer 370; the first electrode S21 of the first control transistor T2 is connected to the second connection sub-wire L4, and the second connection sub-wire L4 is in a same layer as the first electrode S21 of the first control transistor T2 and is integral with the first electrode S21 of the first control transistor T2. The second end of the intermediate transfer electrode 11 is connected to the second connection sub-wire L4 through a via hole H2 penetrating through the third insulation layer 370, thereby realizing the connection between the gate electrode of the first noise reduction transistor T6 and the first electrode of the first control transistor T2.

For example, in this example, the second node N2 includes the intermediate transfer electrode 11 and the second connection wire.

For example, in other examples, the second connection wire only includes the first connection sub-wire L3 or the second connection sub-wire L4. For example, in the example shown in FIG. 2B and FIG. 7C, the case that the second connection wire only includes the second connection sub-wire L4 is taken as an example, but the embodiments of the present disclosure are not limited to this case.

For example, as shown in FIG. 5C and FIG. 7C, in this example, the intermediate transfer electrode 11 may be located in the first conductive layer 320 and integral with the gate electrode of the first noise reduction transistor T6.

For example, as shown in FIG. 7C, the source region S2 of the active layer of the first control transistor T2 is connected to the first electrode S21 of the first control transistor T2 through the via hole H1 penetrating the first insulation layer 350, the second insulation layer 360 and the third insulation layer 370; the first electrode S21 of the first control transistor T2 is connected to the second connection sub-wire L4, the first electrode S21 of the first control transistor T2 is located in a same layer as the second connection sub-wire L4 and is integral with the second connection sub-wire L4, and the second end 112 of the intermediate transfer electrode 11 is connected to the second connection sub-wire L4 through the via hole H2 passing through the third insulation layer 370, thereby realizing the connection between the gate electrode of the first noise reduction transistor T6 and the first electrode of the first control transistor T2.

For example, in this example, the second node N2 includes the intermediate transfer electrode 11 and the second connection sub-wire L4.

For example, as shown in FIG. 6A, the second power line VGL includes a protrusion portion 14 protruding in the second direction. The active layer of the voltage stabilization transistor T8 is located between the active layer of the second control transistor T3 and the active layer of the second noise reduction transistor T7 in the second direction, and the second electrode of the second control transistor T3 and the gate electrode of the voltage stabilization transistor T8 are both connected to the protrusion portion 14 of the second power line VGL. For example, the second electrode of the second control transistor T3 is in a same layer as the protrusion portion 14 on the second power line VGL and is integral with the protrusion portion 14, the gate electrode of the voltage stabilization transistor T8 is connected to the protrusion portion 14 on the second power line VGL which is not in the same layer as the gate electrode of the voltage stabilization transistor T8, for example, through a via hole penetrating through the second insulation layer 360 and the third insulation layer 370 to receive the second voltage; for example, the via hole for connecting the second electrode of the second control transistor T3 and the drain region of the active layer of the second control transistor T3 and the via hole for connecting the gate electrode of the voltage stabilization transistor T8 and the protrusion portion 14 respectively overlap with different sides of the protrusion portion 14 (for example, they respectively overlap with an upper side and a lower side of the protrusion portion 14 in the first direction as shown in FIG. 2A), for example, they are located at different opposite corners of the protrusion portion 14 (for example, they overlap with an upper left corner and a lower right corner of the protrusion portion 14 in the first direction as shown in FIG. 2A).

In the embodiments of the present disclosure, the first control transistor T2 and the second control transistor T3 are arranged up and down in the first direction as shown in FIG. 2A instead of being arranged side by side in the second direction as shown in FIG. 1D, so that the width of the peripheral region of the display panel in the second direction can be reduced, and thus the distances between other transistors (for example, the voltage stabilization transistor T8) and the second power line VGL can be shortened, moreover, because the second electrode (e.g., the source electrode) of the second control transistor T3 and the gate electrode of the voltage stabilization transistor T8 are both connected to the protrusion portion 14 on the second power line VGL, thus the second electrode of the second control transistor T3 and the gate electrode of the voltage stabilization transistor T8 are closer to each other in space, thereby reducing the wire length and facilitating the realization of the narrow frame of the display panel.

For example, as shown in FIG. 2A and FIG. 5A, the first electrode CE11 of the first capacitor C1 and the second electrode CE12 of the first capacitor C1 respectively include a notch, and the signal input electrode 13 connected to the first connection wire L1 extending along the second direction is formed in the notch of the first capacitor C1. For example, an orthographic projection of the signal input electrode 13 on the base substrate falls into an orthographic projection of the notch of the first capacitor C1 on the base substrate, so that the shape of the first electrode CE11 and the shape of the second electrode CE12 of the first capacitor C1 are complementary to the shape of signal input electrode 13, which enables to the full use of the space on the display substrate, thus facilitating the realization of the narrow frame design of the display panel.

It should be noted that although the shape of the first capacitor C1 is changed, the size of the first capacitor C1 generally cannot be changed, and for example, the size change of the first capacitor C1 may fluctuate by 10%~20% up and down, and the specific shape of the first capacitor C1 may be designed and arranged according to other structures, the embodiments of the present disclosure are not limited to this case.

For example, as shown in FIG. 2A and FIG. 4A, an orthographic projection of the third connection wire L2 (located in the first conductive layer 320) connecting the clock signal line (e.g., the first sub-clock signal line GCK) providing the second clock signal and the gate electrode of the second noise reduction transistor T7 on the base substrate 10 overlaps with an orthographic projection of the active layer of the second noise reduction transistor T7 on the base substrate 10 in the first direction, and is at least partially parallel to the gate electrode of the second noise reduction transistor T7. That is, the third connection wire L2 passes through on a side of the active layer of the second noise reduction transistor T7 away from the signal line (for example, the right side of the active layer of the second noise reduction transistor T7 as shown in FIG. 2A).

For example, as shown in FIG. 2A and FIG. 4A, the third connection wire L2 includes a third sub-connection wire L21 and a fourth sub-connection wire L22. The third sub-connection wire L21 extends along the first direction, and the orthographic projection of the third sub-connection wire L21 on the base substrate 10 and the orthographic projection of the active layer of the second noise reduction transistor T7 on the base substrate 10 are arranged side by side in the second direction, the fourth sub-connection wire L22 is connected to the third sub-connection wire L21, and extends along the second direction.

For example, in some examples, as shown in FIG. 4A, the third connection wire L2 is a gate line, that is, the third sub-connection wire L21 and the fourth sub-connection wire L22 are directly connected to each other (no via hole is required to realize the connection) and are integral with each other. For example, the fourth sub-connection wire L22 is connected to the first sub-clock signal line GCK that provides the second clock signal. For example, in another example, as shown in FIG. 4B, the third connection wire L2 includes two gate lines connected to each other through a via hole, one is the third sub-connection wire L21 and the other is the fourth sub-connection wire L22. The connection relationship between the third sub-connection wire L21 and the fourth sub-connection wire L22 is described in detail below.

For example, the third sub-connection wire L21 connecting the fourth sub-connection wire L22 with the gate electrode of the second noise reduction transistor T7 is also connected to the first electrode of the output transistor T5, which is not in a same layer as the third sub-connection wire L21, through a via hole, so as to connect the first electrode of the output transistor T5 to the second clock signal terminal CB, for example, the second clock signal terminal CB is connected to the first sub-clock signal line GCK. For example, the first electrode of the output transistor T5 is electrically connected to the third sub-connection wire L21, and the third sub-connection wire L21 is located on a side of the active layer of the second noise reduction transistor T7 close to the output transistor T5. For example, an orthographic projection of this via hole on the base substrate 10 is between an orthographic projection of the active layer of the second noise reduction transistor T7 on the base substrate 10 and an orthographic projection of the active layer of the output transistor T5 on the base substrate 10. For example, the fourth sub-connection wire L22 is in the first conductive layer 320, and an orthographic projection of the fourth sub-connection wire L22 on the base substrate 10 is between an orthographic projection of the voltage stabilization transistor T8 of the X-th stage of shift register unit on the base substrate 10 and an orthographic projection of the input transistor T1 of the (X+1)-th stage of shift register unit on the base substrate 10.

For example, the gate electrode of the output transistor T5 is electrically connected to the first electrode of the voltage stabilization transistor T8, and the second electrode of the output transistor T5 is connected to the output terminal GOUT.

For example, in some examples, as shown in FIG. 2A, FIG. 4A, FIG. 5C and FIG. 7D, the first electrode S51 of the output transistor T5 is connected to the source region S5 of the output transistor T5 through a via hole H7 penetrating through the first insulation layer 350, the second insulation layer 360 and the third insulation layer 370, and the first electrode S51 of the output transistor T5 is connected to the fourth connection wire L5, for example, the first electrode S51 of the output transistor T5 and the fourth connection wire L5 are in a same layer and are integral with each other, the fourth connection wire L5 is connected to the third sub-connection wire L21 through a via hole H5 and a via hole H6 that penetrate through the second insulation layer 360 and the third insulation layer 370, and the third sub-connection wire L21 is connected to the gate electrode of the second noise reduction transistor T7 and the fourth sub-connection wire L22, so that the first electrode S51 of the output transistor T5 is connected to the gate electrode G7 of the second noise reduction transistor T7, and the first electrode S51 of the output transistor T5 and the gate electrode G7 of the second noise reduction transistor T7 are both connected to the first sub-clock signal line GCK to receive the second clock signal.

For example, in some other examples, as shown in FIG. 2B, FIG. 4B, FIG. 5D, FIG. 6B and FIG. 7E, the first electrode of the output transistor T5 is connected to the fourth connection wire L5, the first electrode S51 of the output transistor T5 is connected to the fourth connection wire L5, the first end L51 of the fourth connection wire L5 is connected to the third sub-connection wire L21 located in the second conductive layer 320 through a via hole H8 and a via hole H9 that penetrate the second insulation layer 360 and the third insulation layer 370, the second end L52 of the fourth connection wire 15 is connected to the fourth sub-connection wire L22 located in the second conductive layer 320 through a via hole H5 and a via hole H6 that penetrate the second insulation layer 360 and the third insulation layer 370, the third sub-connection wire L21 is directly connected to and integral with the gate electrode G7 of the second noise reduction transistor T7, so that the first electrode of the output transistor T5 is connected to the gate electrode G7 of the second noise reduction transistor T7, and the first electrode of the output transistor T5 and the gate electrode G7 of the second noise reduction transistor T7 are both connected to the first sub-clock signal line GCK through the fourth connection wire L5 and the fourth sub-connection wire L22 to receive the second clock signal.

For example, as shown in FIG. 2A, FIG. 3A and FIG. 4A, the active layer of the output control transistor T4 and the active layer of the output transistor T5 are formed by a first output semiconductor layer A13 and a second output semiconductor layer A14 (i.e., the active layer of the output control transistor T4 and the active layer of the output transistor T5 are integral) and extend along the first direction. For example, the active layer of the output control transistor T4 is located on an imaginary line on which the active layer of the output transistor T5 extends along the first direction. For example, the active layer of the output control transistor T4 includes an upper part of the third semiconductor layer A13 and an upper part of the fourth semiconductor layer A14 that extend along the first direction, and the active layer of the output transistor T5 includes a lower part of the third semiconductor layer A13 and an lower part of the fourth semiconductor layer A14 that extend along the first direction. It should be noted that the ratio of the active layer of the output control transistor T4 and the active layer of the output transistor T5 to the third semiconductor layer A13 and the fourth semiconductor layer A14, respectively, can be set according to the actual situation, the embodiments of the present disclosure are not limited to this case. For example, the gate electrode of the output control transistor T4 and the gate electrode of the output transistor T5 extend along the second direction and overlap with each other in the first direction, that is, the output control transistor T4 and the output transistor T5 are arranged up and down along the first direction. For example, the gate electrode of the output control transistor T4 is located on an imaginary line of the gate electrode of the output transistor T5 in the first direction. For example, the first electrode of the output control transistor T4 is electrically connected to the first power line VGH.

In at least one embodiment of the present disclosure, compared with the case that two sides of the second noise reduction transistor T7 are both provided with the connection wires shown in FIG. 1D, changing the arrangement of the connection wires of the second noise reduction transistor T7 provided by at least one embodiment of the present disclosure (i.e., the wires only pass between the output transistor T5 and the second noise reduction transistor T7) reduces the complexity of wires, avoids the problem of space congestion, and is beneficial to realizing the narrow frame design of the display panel.

For example, in some embodiments of the present disclosure, the wire width of each layer of wires is generally 3 microns, and for example, an interval between adjacent wires in a same layer is greater than 3 microns. For example, the interval between adjacent wires is related to the accuracy of the exposure machine. The higher the accuracy of the exposure machine, the smaller the interval can be, which may be determined according to the actual situation, and the embodiments of the present disclosure are not limited to this case. In at least one embodiment of the present disclosure, necessary an interval must be reserved between the adjacent wires in a same layer to avoid wire adhesion and signal short circuit in the actual process.

A distance between an orthographic projection of each wire of the first conductive layer 320 on the base substrate 10 and an orthographic projection of each wire of the second conductive layer 330 on the base substrate 10 is generally 1.5 microns, for example, the gate electrode of the transistor in the first conductive layer 320 exceeds the active layer of the first conductive layer 320 that is on the semiconductor layer 31 by more than 2 microns. For example, as shown in FIG. 2A, FIG. 3, and FIG. 4, the U-shaped double gate electrode of the first transistor T1 exceeds the strip-shaped active layer of the first transistor T1 by more than 2 microns in the first direction at both two sides of the strip-shaped active layer of the first transistor T1, for example, a length of parts of the U-shaped double gate electrode of the first transistor T1 (for example, a first part G11 and a second part G12) that do not overlap with the strip-shaped active layer of the first transistor T1 in the first direction is more than 2 microns, which is not limited to the case in the embodiments of the present disclosure.

For example, the interval between orthographic projection of the active layers of adjacent transistors in the semiconductor layer 310 on the base substrate 10 and the interval between orthographic projections of adjacent gate lines in the first conductive layer 320 on the base substrate 10 is more than 1.5 microns, so that the channel effect among the gate lines and the active layers of the transistors in the semiconductor layer 310 can be avoided. For example, an interval between an orthographic projection of the semiconductor layer 310 on the base substrate 10 and an orthographic projection of the second conductive layer 330 on the base substrate 10 is unlimited, and the two may overlap with each other. For example, in some embodiments of the present disclosure, a certain interval is reserved as far as possible between different layers of wires (this interval is smaller than that between adjacent wires in a same layer), which can reduce unnecessary overlap and avoid interference caused by excessive parasitic capacitance.

For example, the width of each wire of the third conductive layer 340 should cover the corresponding via hole in the respective wire, this width may exceed the size of the corresponding via hole (for example, the diameter of the via hole) by more than 1 micron, for example, the size of the via hole is in a range of 2.0-2.5 microns, and the width of the respective wire of the third conductive layer 340 covering the via hole is in a range of 4-5 microns. For example, the wire widths of the wires corresponding to the via holes of the output control transistor T4 and the output transistor T5 exceed the respective via holes by 1 micron up and down, for example, are in a range of 4.0-4.5 microns, because there are many via holes corresponding to the output control transistor T4 and the output transistor T5, and the widths of the wires connected to other transistors in the third conductive layer 340 only needs to meet the requirement of covering the respective via holes by more than 1 micron, for example, the wire width between the via holes can be smaller.

For example, intervals among the first sub-clock signal line GCK, the second sub-clock signal line GCB, the first power line VGH, the second power line VGL, etc., that are located in the third conductive layer 340, are more than 3 microns. In order to meet the driving capability requirements, the first sub-clock signal line GCK and the second sub-clock signal line GCB have a wire width of more than 9 microns, and the second power line VGL may have a wire width of 6 microns, 9 microns or 10 microns. The first power line VGH has a wire width of 10 microns, the reference voltage wire Vinit has a wire width of 15 microns, the second voltage provided by the second power line VGL is generally −7V, and the reference voltage provided by the reference voltage wire Vinit is −3V, because the reference voltage wire Vinit is required to drive the whole pixel array of the display panel, and the first power line VGH and the second power line VGL are only required to drive the gate driving circuits located in the peripheral region of the display panel, therefore the wire width of the reference voltage wire Vinit is larger than that of the first power line VGH and the second power line VGL.

For example, in some examples, the thickness of the first conductive layer 320 and the thickness of the second conductive layer 330 is in a range of 2000-300 Angstroms, and the thickness of the third conductive layer 340 is in a range of 5000-8000 Angstroms, the embodiments of the present disclosure are not limited to this case.

For example, in some embodiments of the present disclosure, the protrusion portion is provided on the second power line VGL in order to shorten the connection wire connecting the gate electrode of the voltage stabilization transistor T8 and the active layer of the second control transistor T3. If the active layer of the second control transistor T3 is too long, the doped conductor resistance will be larger. For example, in some embodiments of the present disclosure, the shape of the wire of the first node N1 in the third conductive layer 340 (i.e., the intermediate transfer electrode 11) is designed so as not to overlap with orthographic projections of the wires or electrodes of other layers on the base substrate 10 as much as possible, and is arranged at a position in the interval (gap) between the wires, thereby avoiding crosstalk caused by overlapping wires.

It should be noted that in at least one embodiment of the present disclosure, for example, the first transfer electrode 17, the second transfer electrode 18 and the third transfer electrode 16 are in the third conductive layer 340. For example, the first transfer electrode 17 is an electrode for connecting the input transistor T1, the first control transistor T2, the second noise reduction transistor T7 and the voltage stabilization transistor T8 shown in FIG. 1B, for example, the first node N1 includes the first transfer electrode 17. For example, the second transfer electrode 18 is an electrode for connecting the voltage stabilization transistor T8 and the output transistor T5, and the third node N3 includes the second transfer electrode 18. For example, the intermediate transfer electrode 11 is an electrode for connecting the first control transistor T2, the second control transistor T3 and the first noise reduction transistor T6, and may be located in the second conductive layer 330 or the first conductive layer 320. In the case that the intermediate transfer electrode 11 is located in the second conductive layer 330 and adopts the connection mode shown in FIG. 7B, the second node N2 includes the intermediate transfer electrode 11 and the third sub-connection wire L3 and the fourth sub-connection wire L4 that are in the third conductive layer 340 and are connected to the intermediate transfer electrode 11. For example, the wire transfer electrode 12 is located in the first conductive layer 320 and is a transfer electrode connected to the first connection wire L1 located in the third conductive layer 340, or both the wire transfer electrode 12 and the first connection wire L1 are located in a same layer, the embodiments of the present disclosure are not limited to this case.

For example, by arranging the above-mentioned transfer electrodes and connection wires, problems such as wire adhesion and signal short circuit caused by dense wires in a same layer can be avoided. For example, the above-mentioned transfer electrodes and connection wires functions as connection or jumper connection.

The optimized circuit connection and structural layout of the shift register unit in the display substrate provided by the above embodiments of the present disclosure reduce the length of the shift register unit to a certain extent, which is beneficial to realize the narrow frame design of the display panel and ensures the display quality of the display panel at the same time.

Figure 8:
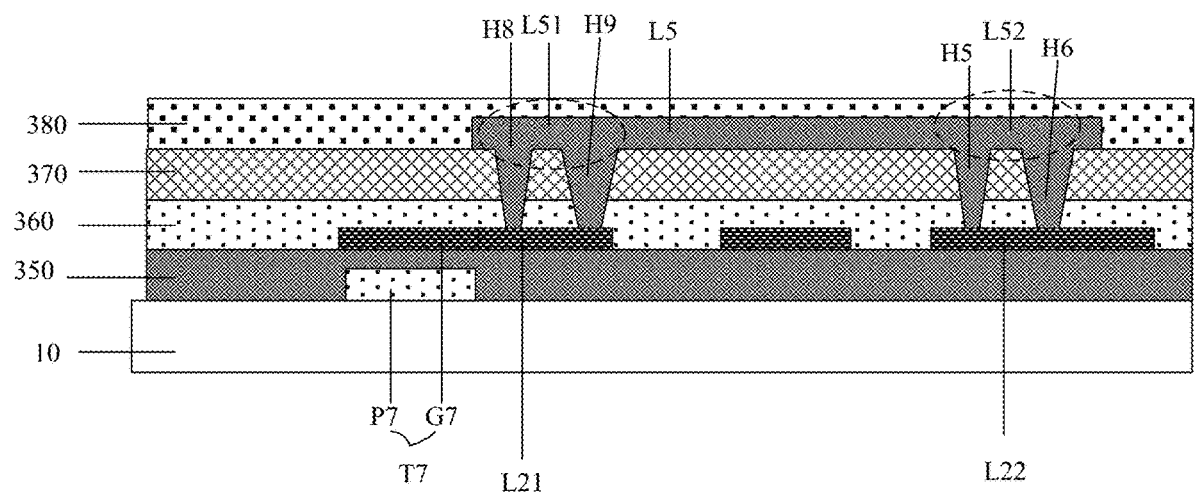
FIG. 8 is a schematic diagram of a display device provided by at least one embodiment of the present disclosure.
Figure 8:
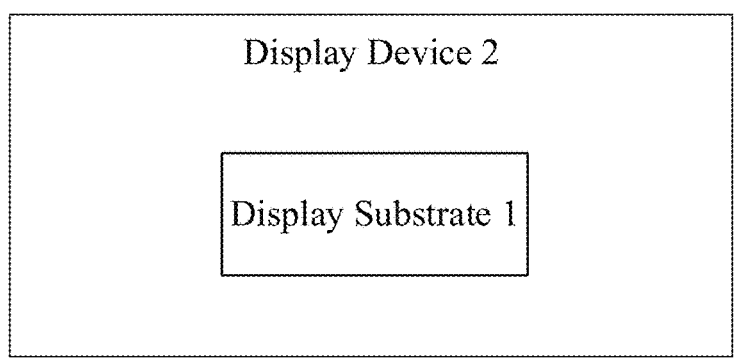

At least one embodiment of the present disclosure further provides a display device. FIG. 8 is a schematic diagram of a display device provided by at least one embodiment of the present disclosure. As shown in FIG. 8, the display device 2 includes the display substrate 1 provided by any one of the embodiments of the present disclosure, for example, the display substrate 1 shown in FIG. 2A or 2B.

It should be noted that the display device 2 may be any product or component with display function, such as OLED panel, OLED TV, QLED panel, QLED TV, mobile phone, tablet computer, notebook computer, digital photo frame, navigator, etc. The display device 2 may also include other components, such as a data driving circuit, a timing controller, etc., and the embodiments of the present disclosure are not limited to this case.

It should be noted that, in order to be clearly and concisely, the embodiments of the present disclosure do not give all the constituent units of the display device. In order to realize a substrate function of the display device, those skilled in the art can provide and set other unillustrated structures according to specific needs, the embodiments of the present disclosure are not limited to this case.

With regard to the technical effects of the display device 2 provided by the above embodiments, reference can be made to the technical effects of the display substrate 1 provided in the embodiments of the present disclosure, which is not repeated here.

Figure 9:
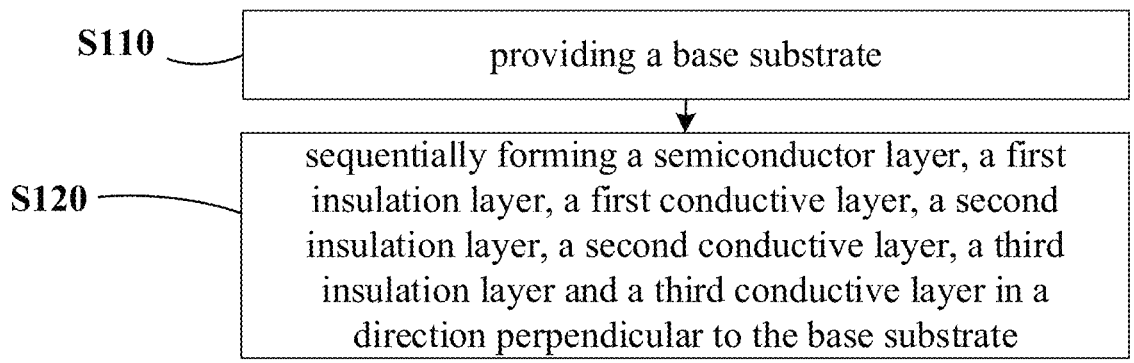
FIG. 9 is a flowchart of a manufacturing method of a display substrate provided by at least one embodiment of the present disclosure.

At least one embodiment of the present disclosure further provides a manufacturing method of the display substrate. FIG. 9 is a flowchart of the manufacturing method of the display substrate provided by at least one embodiment of the present disclosure. For example, the manufacturing method can be used to manufacture the display substrate provided by any one of the embodiments of the present disclosure. For example, the manufacturing method can be used to manufacture the display substrate shown in FIG. 2A.

As shown in FIG. 9, the manufacturing method of the display substrate includes steps S110 to S120.

Step S110: providing abase substrate.

Step S120: sequentially forming a semiconductor layer, a first insulation layer, a first conductive layer, a second insulation layer, a second conductive layer, a third insulation layer and a third conductive layer in a direction perpendicular to the base substrate.

For example, forming the semiconductor layer, the first insulation layer, the first conductive layer, the second insulation layer, the second conductive layer, the third insulation layer and the third conductive layer respectively includes forming corresponding material layers (e.g., a semiconductor material layer, an insulation material layer or a conductive material layer), and then performing a patterning process on the material layers to form corresponding pattern structures (e.g., active layers, an electrode patterns, wires, via holes, etc.). The patterning process is, for example, a photolithography process, which includes, for example, coating a photoresist layer on a material layer to be patterned, exposing the photoresist layer with a mask, developing the exposed photoresist layer to obtain a photoresist pattern, etching the structural layer with the photoresist pattern, and optionally removing the photoresist pattern.

For the step S110, for example, the base substrate 10 may be made of glass, plastic, quartz, or other suitable materials, and the embodiments of the present disclosure are not limited to this case.

For example, a shift register unit, a first power line, a second power line, a first clock signal line and a second clock signal line are formed on the base substrate.

For the step S120, for example, forming the shift register unit includes sequentially forming a semiconductor layer, a first insulation layer, a first conductive layer, a second insulation layer, a second conductive layer, a third insulation layer and a third conductive layer in the direction perpendicular to the base substrate.

For example, a first power line VGH, a second power line VGL, a plurality of clock signal lines (e.g., a trigger signal line GSTV, a first sub-clock signal line GCK, a second sub-clock signal line GCB, etc.); the first electrode and the second electrode of each transistor included in the shift register unit 104, and connection wires and transfer electrodes, that connect the transistors and the capacitor, are located in the third conductive layer 340, the active layers of the transistors are located in the semiconductor layer 310, the gate electrodes of the transistors and the first electrodes of the capacitors included in the shift register unit are located in the first conductive layer 320, and the second electrodes of the capacitors are formed in the second conductive layer 330. Each transistor and each capacitor are respectively connected to the first power line VGH, the second power line VGL, the plurality of clock signal lines, and connection wires and transfer electrodes through via holes penetrating through the first insulation layer 310, the second insulation layer 320 or the third insulation layer 330.

With regard to the arrangement of connection structures connecting each transistor and capacitor of the shift register unit 104 with the first power line VGH, the second power line VGL, the plurality of clock signal lines, the connection wires and the transfer electrodes, reference can be made to the description of FIGS. 2A-7E, which is not repeated here.

It should be noted that, in various embodiments of the present disclosure, the flow of the manufacturing method of the display substrate may include more or less operations, these operations may be executed sequentially or in parallel. Although the flow of the manufacturing method described above includes a plurality of operations occurring in a specific order, it should be clearly understood that the order of the plurality of operations is not limited to this case. The manufacturing method described above can be executed once or multiple times according to predetermined conditions.

With regard to the technical effects of the manufacturing method of the display substrate provided by the above embodiments, reference can be made to the technical effects of the display substrate provided in the embodiments of the present disclosure, which are not described in detail here.

The following should be noted:

(1) Only the structures involved in the embodiments of the present disclosure are illustrated in the drawings of the embodiments of the present disclosure, and other structures can refer to usual designs;

(2) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A display substrate, comprising:
   a base substrate, comprising a display region and a peripheral region located at least a side of the display region, and a shift register unit and a first clock signal line that are on the peripheral region of the base substrate,
   wherein the first clock signal line extends along a first direction on the base substrate and is connected to a first clock signal terminal to configure to provide a first clock signal to the shift register unit;
   the shift register unit comprises an input circuit, an output circuit, a first control circuit and an output control circuit;
   the input circuit is configured to input an input signal to a first node in response to the first clock signal;
   the output circuit is configured to output an output signal to an output terminal;
   the first control circuit is configured to control a level of a second node in response to a level of the first node and the first clock signal; and
   the output control circuit is configured to control a level of the output terminal under control of a level of the second node,
   the output control circuit comprises an output control transistor and a first capacitor, and
   the output circuit comprises an output transistor and a second capacitor;
   an active layer of the output control transistor and an active layer of the output transistor are integral and extend along the first direction,
   the active layer of the output control transistor and the active layer of the output transistor comprises a first output semiconductor layer and a second output semiconductor layer which are arranged side by side in a second direction different from the first direction, an orthographic projection of the second output semiconductor layer on the base substrate is between an orthographic projection of the first output semiconductor layer on the base substrate and the display region,
   an end of the orthographic projection of the first output semiconductor layer on the base substrate away from the display region comprises a first sub-notch,
   an end of the orthographic projection of the second output semiconductor layer on the base substrate close to the display region comprises a second sub-notch.

2. The display substrate according to claim 1, wherein a projection of an electrode where a gate electrode of the output control transistor is located on the base substrate overlaps with a projection of at least one of the first sub-notch and the second sub-notch on the base substrate.

3. The display substrate according to claim 1, wherein an orthographic projection of an electrode where a first electrode of the output control transistor is located on the base substrate overlaps with an orthographic projection of at least one of the first sub-notch and the second sub-notch on the base substrate.

4. The base substrate according to claim 1, wherein a portion of an orthographic projection of an electrode where a first electrode of the output control transistor is located on the base substrate on a side of the first output semiconductor layer away from the display region comprises a first inclination part, and an extension direction of the first inclination part is different from both of the first direction and the second direction.

5. The display substrate according to claim 1, wherein a portion of an electrode where a first electrode of the output control transistor is located on a side of the second output semiconductor layer close to the display region is an electrode of the first capacitor.

6. The display substrate according to claim 5, wherein the input circuit comprises an input transistor, a first electrode of the input transistor is connected to a signal input electrode through a first connection wire extending along the second direction to receive the input signal, an end of an orthographic projection of a first electrode and a second electrode of the first capacitor on the base substrate away from the display region comprises a notch, a portion of the signal input electrode used to connect to the first connection wire is located in the notch of the first capacitor.

7. The display substrate according to claim 1, wherein an electrode where a gate electrode of the output control transistor is located comprises a first horizontal part extending along the first direction, an end of the first horizontal part away from the display region has a first sub-portion, an orthographic projection of the first sub-portion of the first horizontal part on the base substrate is located within an orthographic projection of the first sub-notch on the base substrate;

the gate electrode of the output control transistor further comprises a second inclination part, the second inclination part is connected to the first sub-portion of the first horizontal part, and an extension direction of the second inclination part is different from both of the first direction and the second direction.

8. The display substrate according to claim 7, wherein a length of the first inclination part in the extension direction of the first inclination part is larger than a length of the second inclination part in the extension direction of the second inclination part.

9. The display substrate according to claim 7, wherein the first inclination part is substantially parallel to the second inclination part.

10. The display substrate according to claim 1, wherein the shift register unit further comprises a second control circuit, the second control circuit is connected to the first node and the second node and is configured to control the level of the first node under control of the level of the second node and the second clock signal; the second control circuit comprises a first noise reduction transistor connected to the second node and a second noise reduction transistor connected to the first node; the shift register unit further comprises a second connection wire, the second connection wire comprises a first connection sub-wire, a gate electrode of the first noise reduction transistor is connected to the first connection sub-wire through a via hole;

the display substrate further comprises:
a second clock signal line, connected to a second clock signal terminal to configure to provide a second clock signal to the shift register unit; and
a third connection wire, connected to the second clock signal line;
the third connection wire comprises a gate electrode of the second noise reduction transistor, and the third connection wire is connected to the second clock signal line through a via hole.

11. The display substrate according to claim 10, further comprising a fourth connection wire, wherein a first electrode of the output transistor is electrically connected to the second clock signal terminal, the second clock signal terminal is electrically connected to the fourth connection wire, the fourth connection wire comprises a first portion and a second portion, both of the first portion of the fourth connection wire and the second portion of the fourth connection wire extend along the second direction and are arranged in a space along the first direction, the first portion of the fourth connection wire is located on a side of the gate electrode of the output transistor away from a gate electrode of the output control transistor, the second portion of the fourth connection wire is located a side of the output transistor close to the gate electrode of the output control transistor;

the fourth connection wire is connected to the third connection wire through a via hole, the first electrode of the output transistor and a gate electrode of the second noise reduction transistor are connected to the second clock signal line to receive the second clock signal.

12. The display substrate according to claim 11, wherein the fourth connection wire further comprises:
a via hole connection part, connected to an end of the second portion of the fourth connection wire along the second direction away from the display region, and electrically connected to the third connection wire by a via hole; and
a third inclination part, connected to the via hole connection part directly, wherein an included angle of an extension direction of the third inclination part and an extension direction of the via hole connection part is greater than 20°.

13. The display substrate according to claim 10, wherein the third connection wire comprises a horizontal part and a fourth inclination part, at least a part of the horizontal part of the third connection wire is used as the gate electrode of the second noise reduction transistor, at least a part of the fourth inclination part is located on a side of the horizontal part of the third connection wire away from the display region and extends toward a direction away from the display region, to electrically connect to the second clock signal line.

14. The display substrate according to claim 10, wherein an extension direction of the gate electrode of the first noise reduction transistor is parallel to an extension direction of the gate electrode of the second noise reduction transistor, or the extension direction of the gate electrode of the first noise reduction transistor is not parallel to the extension direction of the gate electrode of the second noise reduction transistor.

15. The display substrate according to claim 14, wherein, in a case where the extension direction of the gate electrode of the first noise reduction transistor is not parallel to an extension direction of the gate electrode of the second noise reduction transistor, an included angle of the extension direction of the gate electrode of the first noise reduction transistor and the extension direction of the gate electrode of the second noise reduction transistor is less than or equal to 20°.

16. The display substrate according to claim 10, wherein both of a wire width of the second clock signal line and a wire width of the first clock signal line is more than 9 microns.

17. An electronic apparatus, comprising the display substrate according to claim 1.

* * * * *